United States Patent
Yoshida et al.

(10) Patent No.: US 12,431,443 B2
(45) Date of Patent: Sep. 30, 2025

(54) SEMICONDUCTOR DEVICE AND METHOD OF MANUFACTURING THE SEMICONDUCTOR DEVICE

(71) Applicant: ROHM CO., LTD., Kyoto (JP)

(72) Inventors: Kazuki Yoshida, Kyoto (JP); Hajime Kataoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 428 days.

(21) Appl. No.: 17/706,230

(22) Filed: Mar. 28, 2022

(65) Prior Publication Data

US 2022/0320012 A1 Oct. 6, 2022

(30) Foreign Application Priority Data

Mar. 30, 2021 (JP) .................. 2021-056817

(51) Int. Cl.
*H01L 23/00* (2006.01)
*H01L 21/48* (2006.01)
*H01L 23/495* (2006.01)

(52) U.S. Cl.
CPC ........ *H01L 23/562* (2013.01); *H01L 21/4825* (2013.01); *H01L 21/4828* (2013.01);
(Continued)

(58) Field of Classification Search
CPC ............ H01L 23/562; H01L 23/49513; H01L 23/4952; H01L 23/49524; H01L 23/49562; H01L 23/3107; H01L 2224/02166; H01L 2224/02126; H01L 2224/0215; H01L 2224/034; H01L 2224/0361;
(Continued)

(56) References Cited

U.S. PATENT DOCUMENTS

2008/0224315 A1* 9/2008 Miyata ................ H01L 24/84
257/E23.141
2010/0181650 A1* 7/2010 Shigihara ............ H01L 24/11
257/E23.179
(Continued)

FOREIGN PATENT DOCUMENTS

DE 112013006790 T5 * 12/2015 ............. H01L 21/78
DE 102014116082 A1 * 5/2016 ....... H01L 23/49524
(Continued)

OTHER PUBLICATIONS

Notice of Reasons for Refusal for corresponding Japanese Patent Application No. 2021-056817 mailed Nov. 26, 2024 (10 pages; with English translation).

*Primary Examiner* — Teresa M. Arroyo
(74) *Attorney, Agent, or Firm* — XSENSUS LLP

(57) ABSTRACT

A semiconductor device includes: a semiconductor element that includes an element main body having an element main surface and an element back surface facing opposite sides to each other in a thickness direction, and a first electrode arranged on the element main surface; an insulator that has an annular shape overlapping an outer peripheral edge of the first electrode when viewed in the thickness direction and is arranged over the first electrode and the element main surface; a first metal layer arranged over the first electrode and the insulator; and a second metal layer laminated on the first metal layer and overlapping both the first electrode and the insulator when viewed in the thickness direction.

19 Claims, 31 Drawing Sheets

(52) U.S. Cl.
CPC .... *H01L 23/49513* (2013.01); *H01L 23/4952* (2013.01); *H01L 23/49524* (2013.01); *H01L 23/49562* (2013.01); *H01L 24/32* (2013.01); *H01L 24/40* (2013.01); *H01L 24/48* (2013.01); *H01L 24/73* (2013.01); *H01L 2224/40245* (2013.01); *H01L 2224/48245* (2013.01); *H01L 2224/73221* (2013.01); *H01L 2224/73263* (2013.01); *H01L 2224/73265* (2013.01); *H01L 2924/13091* (2013.01); *H01L 2924/35121* (2013.01)

(58) Field of Classification Search
CPC ... H01L 2224/0362; H01L 2224/05124; H01L 2224/05147; H01L 2224/05155; H01L 2224/05166; H01L 2224/05624; H01L 2224/05639; H01L 2224/05647; H01L 2224/05655; H01L 2224/291; H01L 2224/37012; H01L 2224/37147; H01L 2224/40499; H01L 2224/45099; H01L 2224/83447; H01L 2224/83455; H01L 2224/84447; H01L 2224/84455; H01L 2224/85447; H01L 2224/85455; H01L 2224/04026; H01L 2224/04034; H01L 2224/04042; H01L 2224/0603; H01L 2224/06181; H01L 2224/32245; H01L 2224/48247; H01L 2224/48465; H01L 2224/83801; H01L 2224/84801; H01L 2224/40245; H01L 2224/48245; H01L 2224/73221; H01L 2224/73263; H01L 2224/73265; H01L 24/37; H01L 24/06; H01L 24/32; H01L 24/40; H01L 24/48; H01L 24/73; H01L 24/29; H01L 24/03; H01L 24/05; H01L 2924/181; H01L 2924/19107; H01L 2924/00014; H01L 2924/13091; H01L 2924/35121; H01L 21/4825; H01L 21/4828

See application file for complete search history.

(56) References Cited

U.S. PATENT DOCUMENTS

| | | | |
|---|---|---|---|
| 2010/0181685 A1* | 7/2010 | Masleid | G06F 30/394 257/E23.079 |
| 2012/0181685 A1* | 7/2012 | Ohno | H01L 23/3142 257/734 |
| 2013/0113109 A1* | 5/2013 | Nagano | H10D 86/441 257/773 |
| 2016/0379946 A1* | 12/2016 | Maekawa | H01L 24/05 257/773 |
| 2018/0212028 A1* | 7/2018 | Kuno | H10D 12/038 |
| 2022/0328437 A1* | 10/2022 | Yoshida | H01L 24/40 |

FOREIGN PATENT DOCUMENTS

| | | | | |
|---|---|---|---|---|
| JP | 63037623 A | * | 2/1988 | |
| JP | H1-120848 A | | 5/1989 | |
| JP | 01194336 A | * | 8/1989 | |
| JP | 2001-257226 A | | 9/2001 | |
| JP | 2005-72253 A | | 3/2005 | |
| JP | 2006-024829 A | | 1/2006 | |
| JP | 2006-278551 A | | 10/2006 | |
| JP | 2019050320 A | * | 3/2019 | ........ H01L 21/02118 |
| JP | 2021-002570 A | | 1/2021 | |
| KR | 20070053094 A | * | 5/2007 | ............ H01L 24/06 |

\* cited by examiner

SEMICONDUCTOR DEVICE AND METHOD OF MANUFACTURING THE SEMICONDUCTOR DEVICE

CROSS-REFERENCE TO RELATED APPLICATION

This application is based upon and claims the benefit of priority from Japanese Patent Application No. 2021-056817, filed on Mar. 30, 2021, the entire contents of which are incorporated herein by reference.

TECHNICAL FIELD

The present disclosure relates to a semiconductor device and a method of manufacturing the semiconductor device.

BACKGROUND

There have been proposed various configurations for semiconductor devices equipped with semiconductor elements. Patent Document 1 discloses an example of a conventional semiconductor device. In the semiconductor device disclosed in this document, the peripheral portion of an electrode formed on the surface of a semiconductor element is covered with an insulating film (a passivation film 5 and a polyimide film 11). A portion of the electrode on the semiconductor element, which is located inside the insulating film and is exposed from the insulating film, is referred to as an electrode pad portion. A plurality of metal layers such as titanium (Ti), copper (Cu), and nickel (Ni) are laminated on the electrode pad. These metal layers are formed over the electrode pad and the insulating film.

A stress or impact occurs in the plurality of metal layers on the insulating film depending on the specifications and the usage environments of the semiconductor device. There is a concern that the metal layers may crack or peel off due to the stress or the like.

PRIOR ART DOCUMENT

Patent Document

Japanese Laid-Open Publication No. 2005-72253

SUMMARY

Some embodiments of the present disclosure provide a semiconductor device suitable for suppressing peeling of a plurality of metal layers arranged over an electrode pad portion and an insulator.

According to one embodiment of the present disclosure, a semiconductor device includes: a semiconductor element that includes an element main body having an element main surface and an element back surface facing opposite sides to each other in a thickness direction, and a first electrode arranged on the element main surface; an insulator that has an annular shape overlapping an outer peripheral edge of the first electrode when viewed in the thickness direction and is arranged over the first electrode and the element main surface; a first metal layer arranged over the first electrode and the insulator; and a second metal layer laminated on the first metal layer and overlapping both the first electrode and the insulator when viewed in the thickness direction, wherein the first electrode includes a first electrode pad located inside an inner end edge of the insulator when viewed in the thickness direction, wherein a first end edge, which is an outer peripheral edge of the first metal layer, is located between an outer end edge and the inner end edge of the insulator when viewed in the thickness direction, and wherein a second end edge, which is an outer peripheral edge of the second metal layer, is located between the first end edge and the inner end edge when viewed in the thickness direction.

According to another embodiment of the present disclosure, a method of manufacturing a semiconductor device includes: arranging an insulator over a first electrode and an element main surface on a semiconductor element that includes an element main body having the element main surface facing one side of a thickness direction, and the first electrode arranged on the element main surface; forming a first metal layer material on the first electrode and the insulator; forming a second metal layer material on the first metal layer material; forming a third metal layer material on the second metal layer material; forming, on the third metal layer material, a resist having an opening that overlaps a portion of the insulator when viewed in the thickness direction; performing wet etching on the third metal layer material using the resist as a mask; performing wet etching on the second metal layer material using the resist as a mask; performing wet etching on the first metal layer material using the resist as a mask; performing wet etching on the second metal layer material using the resist as a mask; performing wet etching on the third metal layer material using the resist as a mask; and removing the resist.

Other features and advantages of the present disclosure will become more apparent with the detailed description given below with reference to the accompanying drawings.

DETAILED DESCRIPTION

Figure 1:
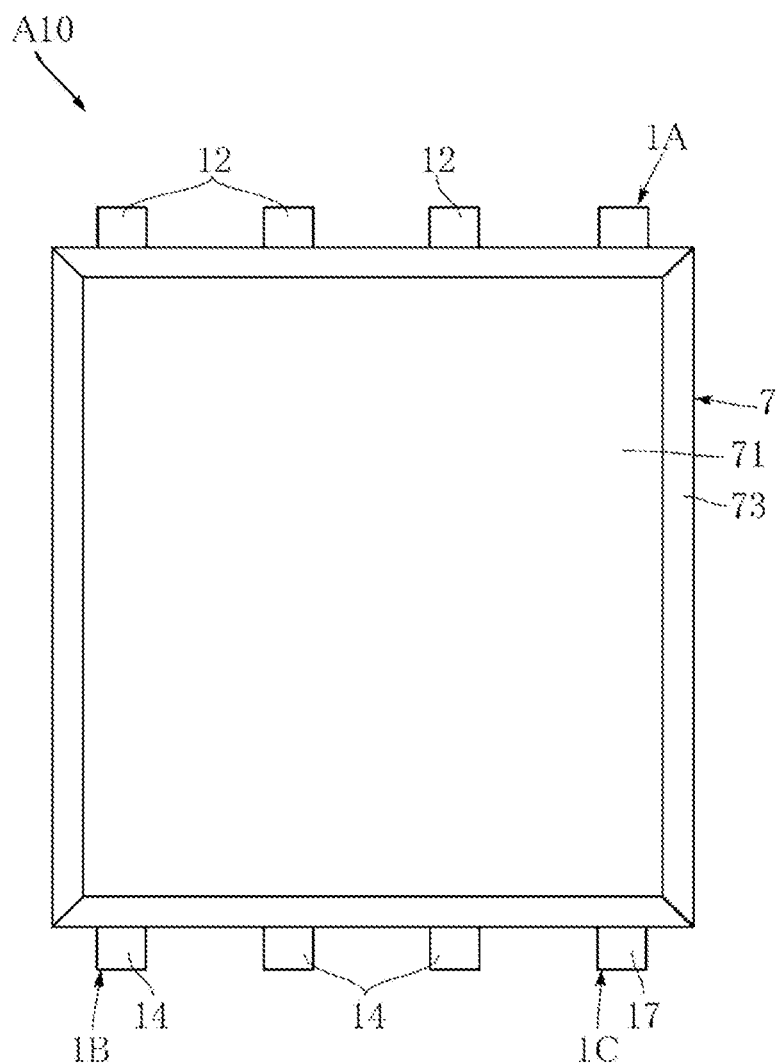
FIG. 1 is a plan view showing a semiconductor device according to a first embodiment of the present disclosure.

Preferred embodiments of the present disclosure will be now described in detail with reference to the drawings.

In the present disclosure, the terms "first," "second," "third," etc. are used merely as labels, and are not intended to mean an order of their objects.

In the present disclosure, the phases "a certain thing A is formed in another certain thing B" and "a certain thing A is formed on another certain thing B" include, unless otherwise specified, "a certain thing A is directly formed in another certain thing B" and "a certain thing A is formed in another certain thing B with another thing interposed between the certain thing A and the another certain thing B." Similarly, the phases "a certain thing A is arranged in another certain thing B" and "a certain thing A is arranged on another certain thing B" include, unless otherwise specified, "a certain thing A is directly arranged in another certain thing B" and "a certain thing A is arranged in another certain thing B with another thing interposed between the certain thing A and the another certain thing B." Similarly, the phase "a certain thing A is located on another certain thing B" includes, unless otherwise specified, "a certain thing A is located on another certain thing B in contact of the certain thing A with the another certain thing B" and "a certain thing A is located on another certain thing B with another thing interposed between the certain thing A and the another certain thing B." In addition, the phase "a certain thing A overlaps with another certain thing B when viewed in a certain direction" includes, unless otherwise specified, "a certain thing A overlaps entirely with another certain thing B" and "a certain thing A overlaps partially with another certain thing B."

First Embodiment

A semiconductor device A10 according to a first embodiment of the present disclosure will be described with reference to FIGS. 1 to 10. The semiconductor device A10 includes a first lead 1A, a second lead 1B, a third lead 1C, a semiconductor element 2, an insulator 3, a metal laminated portion 4, a conductive member 5, a first conductive bonding material 61, a second conductive bonding material 62, a third conductive bonding material 63, and a sealing resin 7.

Figure 2:
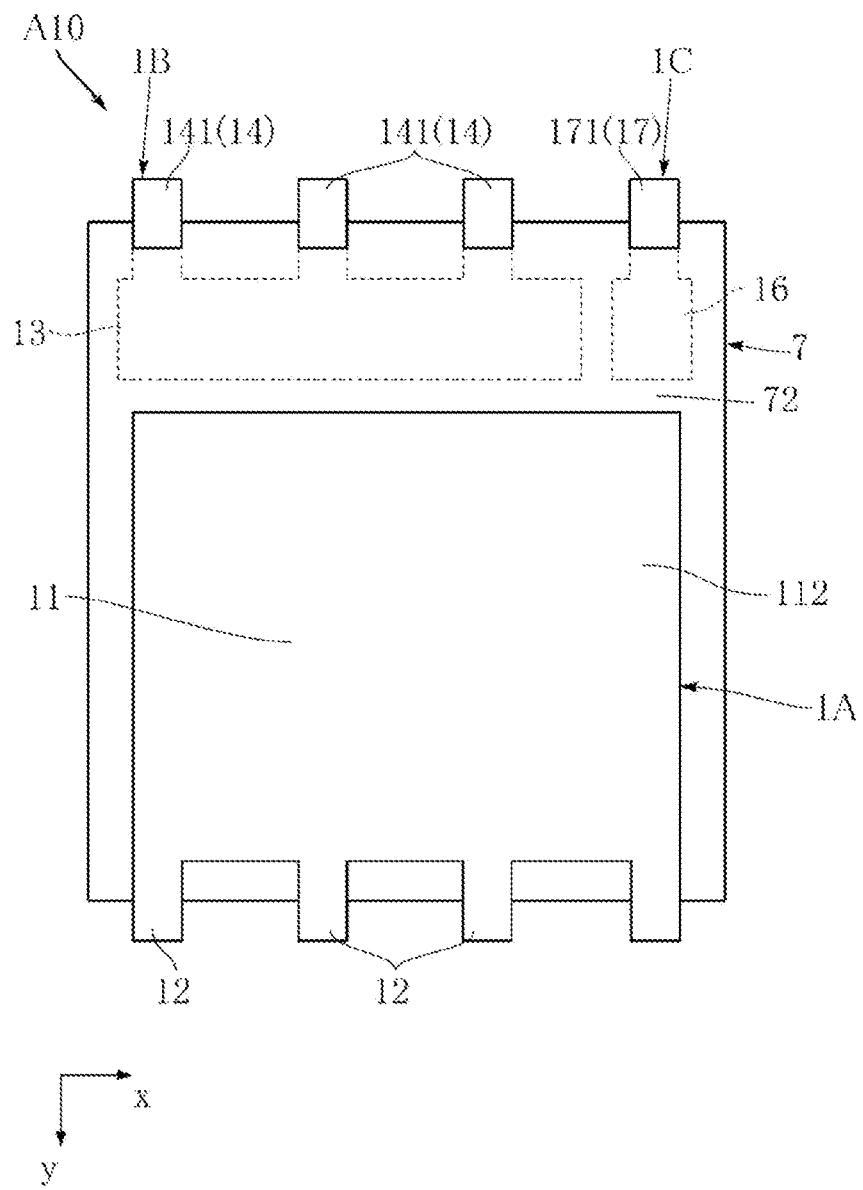
FIG. 2 is a bottom view of the semiconductor device shown in FIG. 1.
Figure 3:
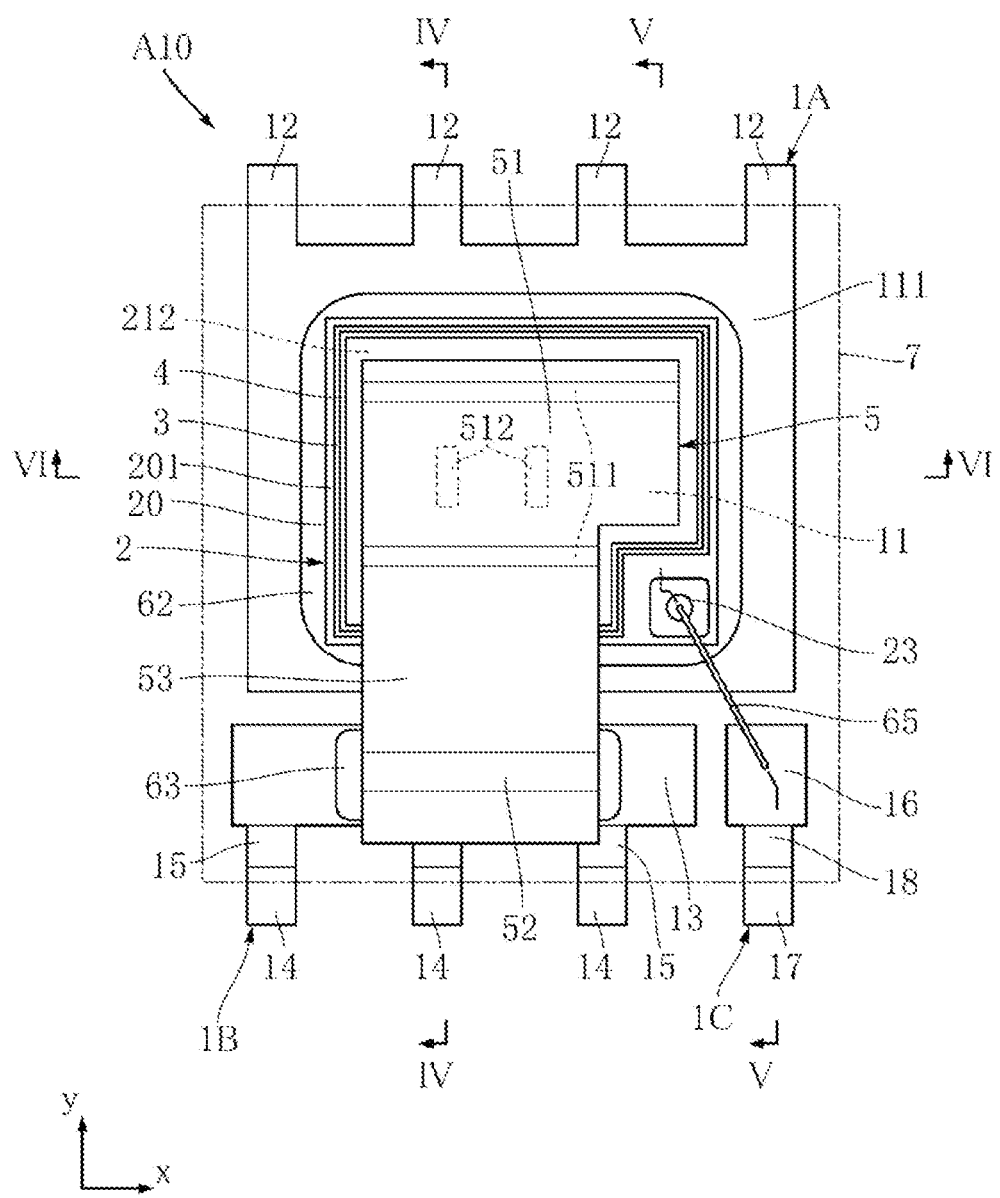
FIG. 3 is a plan view (transparent to a sealing resin) of the semiconductor device shown in FIG. 1.
Figure 4:
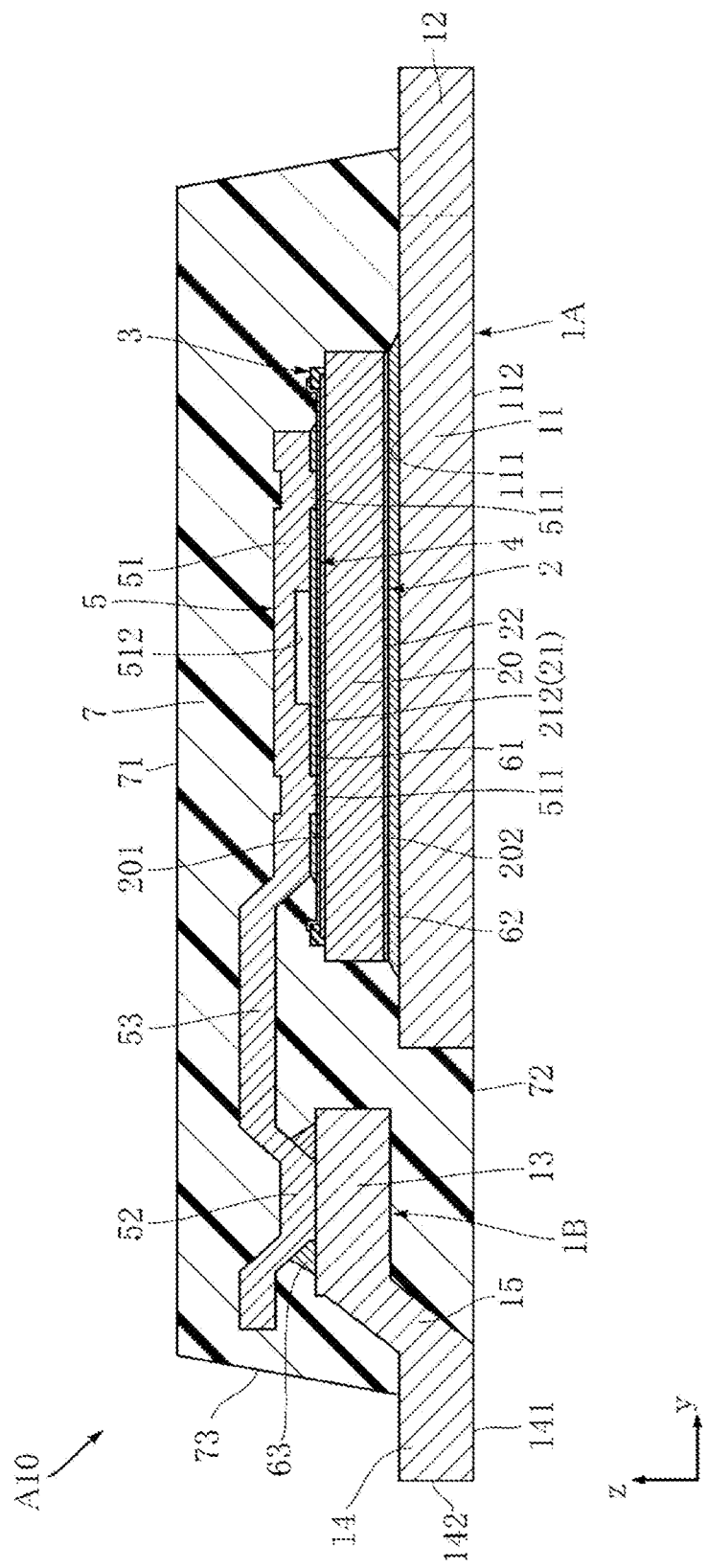
FIG. 4 is a cross-sectional view taken along line IV-IV of FIG. 3.
Figure 5:
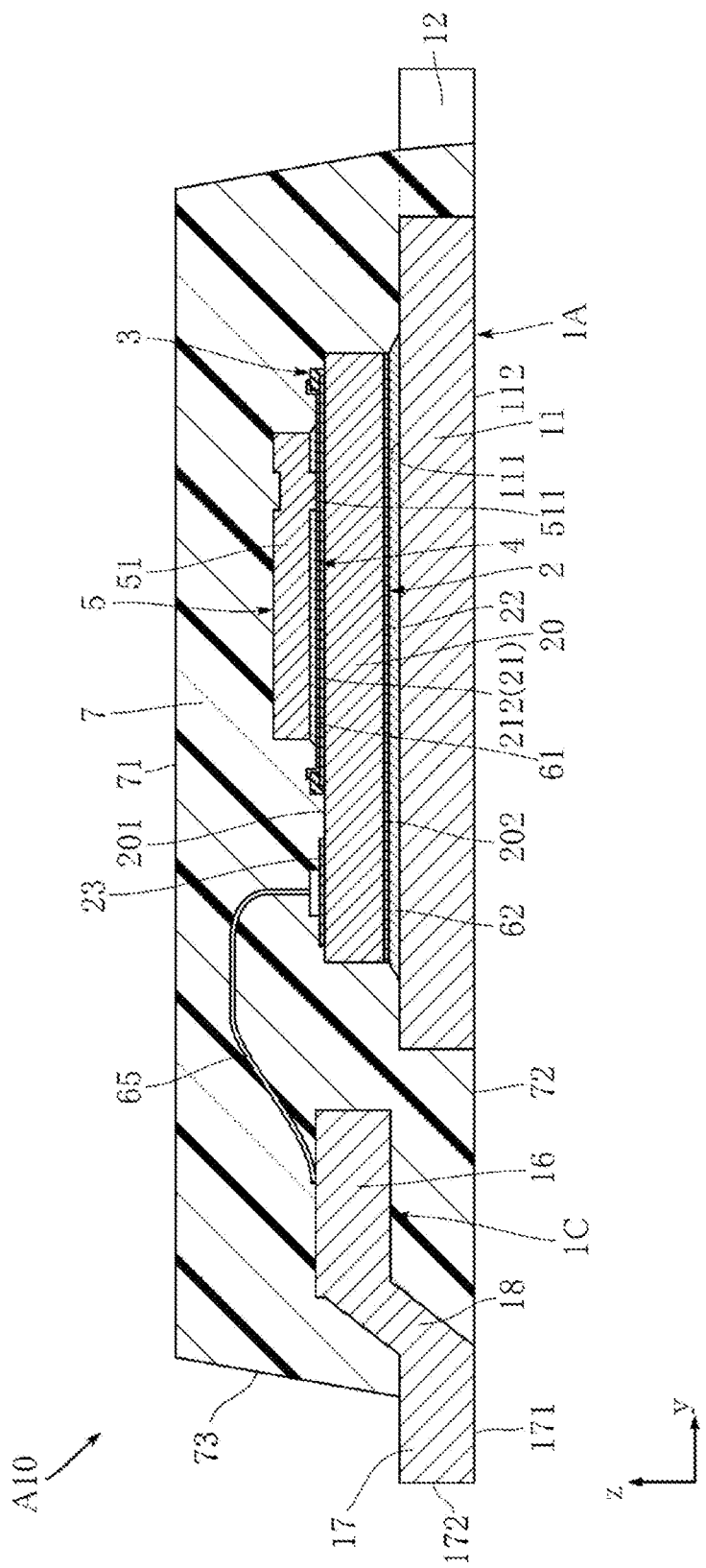
FIG. 5 is a cross-sectional view taken along line V-V of FIG. 3.
Figure 6:
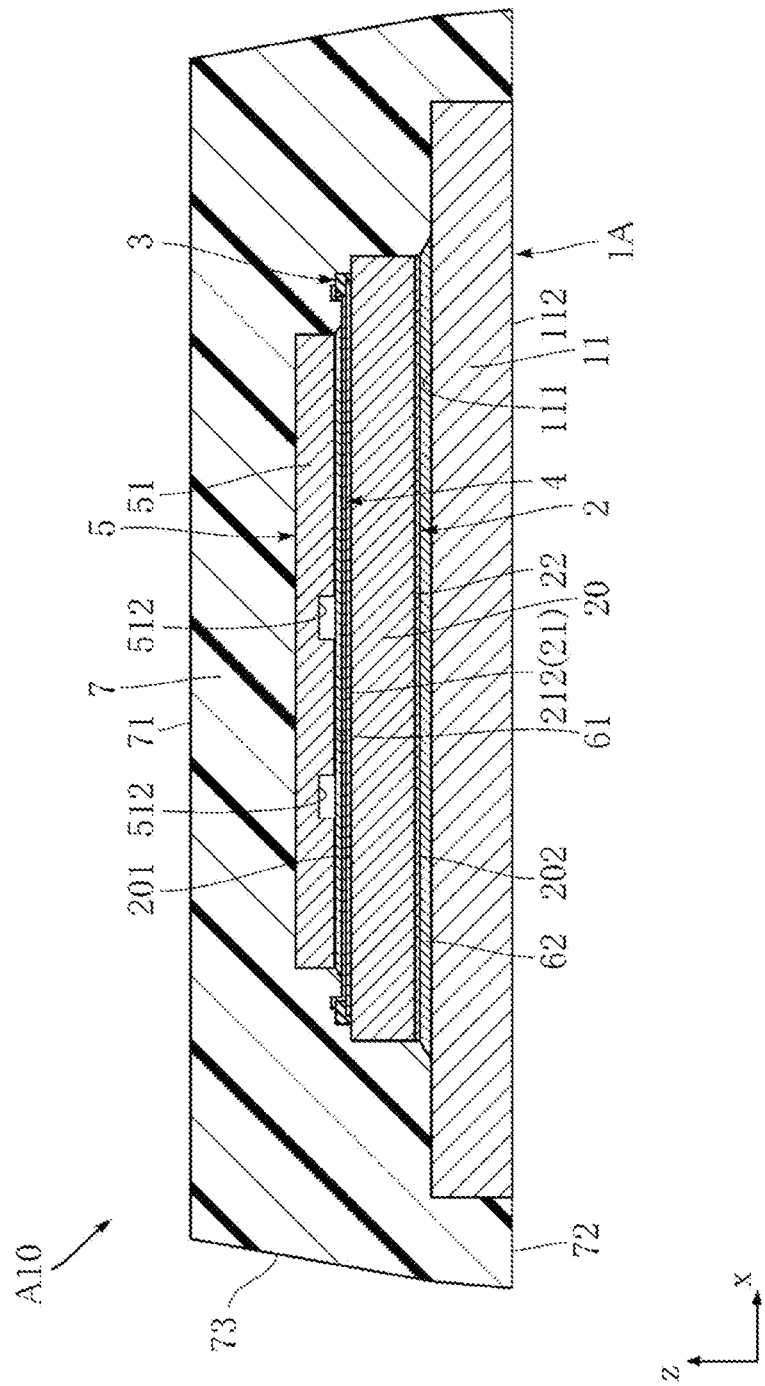
FIG. 6 is a cross-sectional view taken along line VI-VI line of FIG. 3.
Figure 7:
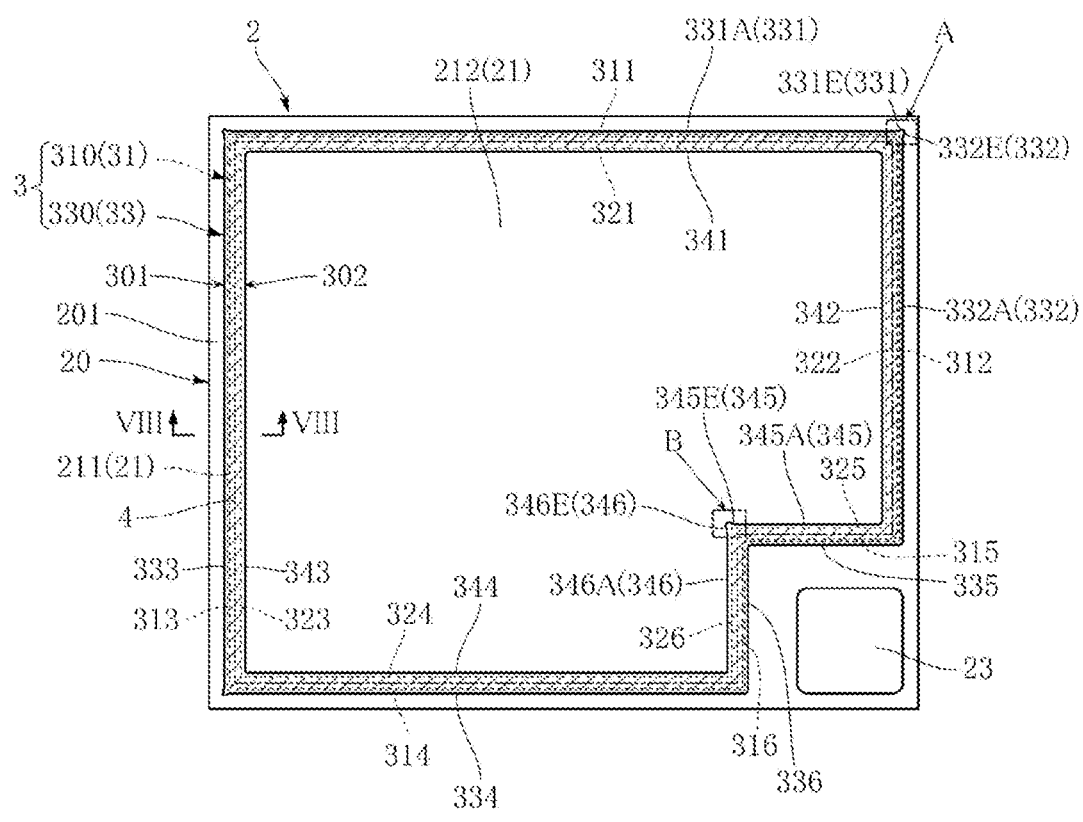
FIG. 7 is a plan view of a semiconductor element.
Figure 8:
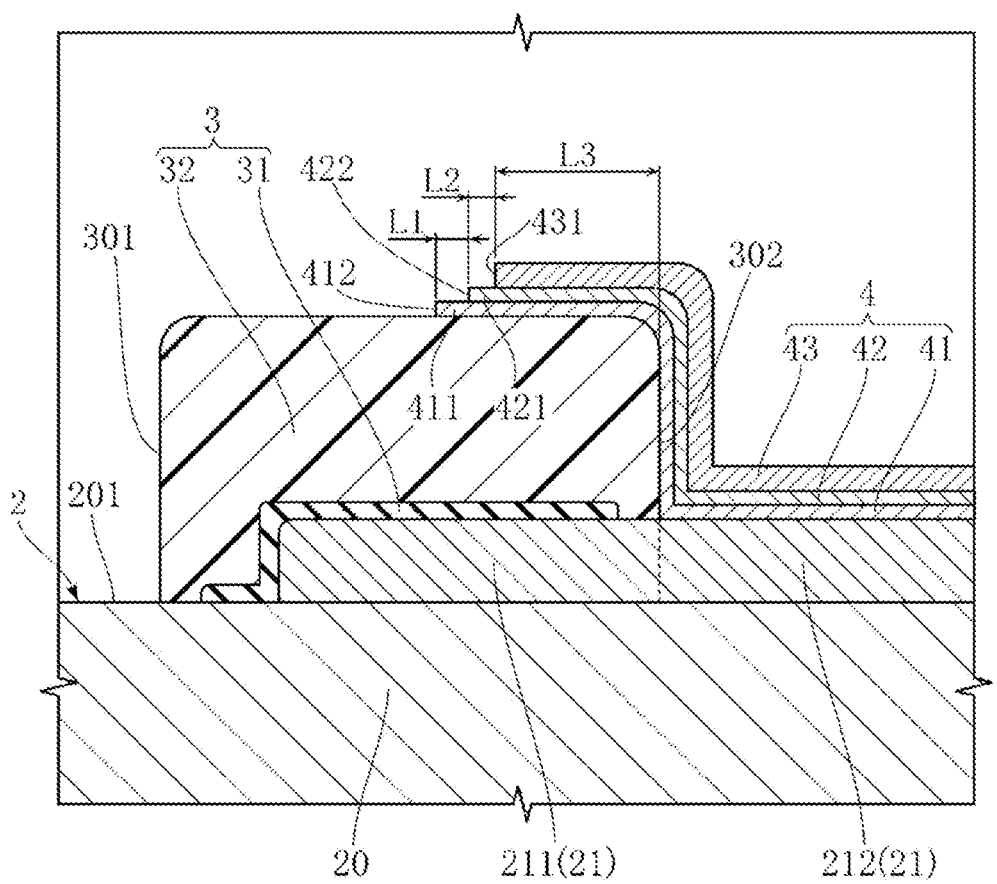
FIG. 8 is an enlarged cross-sectional view taken along line VIII-VIII of FIG. 7.
Figure 9:
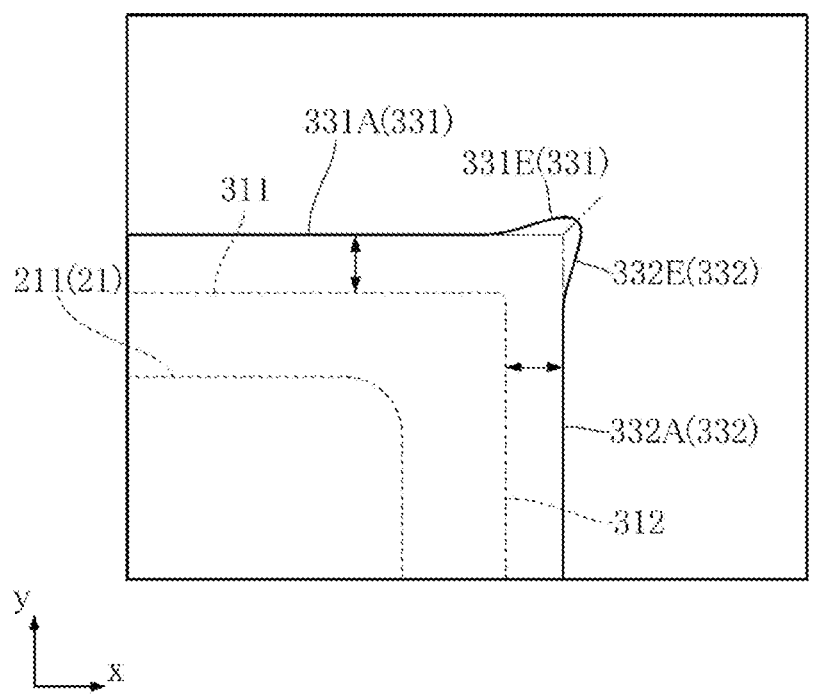
FIG. 9 is an enlarged view of a portion A in FIG. 7.
Figure 10:
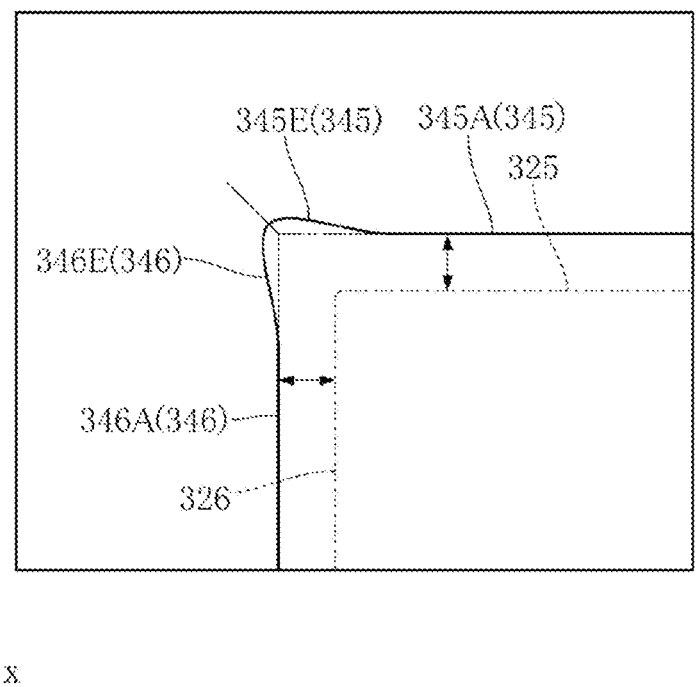
FIG. 10 is an enlarged view of a portion B in FIG. 7.

FIG. 1 is a plan view showing the semiconductor device A10. FIG. 2 is a bottom view showing the semiconductor device A10. FIG. 3 is a plan view showing the semiconductor device A10. FIG. 4 is a cross-sectional view taken along line IV-IV of FIG. 3. FIG. 5 is a cross-sectional view taken along line V-V of FIG. 3. FIG. 6 is a cross-sectional view taken along line VI-VI of FIG. 3. FIG. 7 is a plan view showing a semiconductor element. FIG. 8 is an enlarged cross-sectional view taken along line VIII-VIII of FIG. 7. FIG. 9 is an enlarged view of a portion A of FIG. 7. FIG. 10 is an enlarged view of a portion B of FIG. 7. FIG. 3 is transparent to the sealing resin 7 for the sake of convenience of understanding. FIG. 7 is transparent to the metal laminated portion 4.

In the description of the semiconductor device A10, a thickness direction of the semiconductor element 2 is referred to as a "thickness direction z." A direction orthogonal to the thickness direction z is referred to as a "first direction x." A direction orthogonal to both the thickness direction z and the first direction x is referred to as a "second direction y." As shown in FIGS. 1 and 2, the semiconductor device A10 has substantially a rectangular shape when viewed in the thickness direction z. Further, in the description of the semiconductor device A10, for the sake of convenience, in FIG. 1, the right side in the figure is referred to as "one side of the first direction x," and the left side in the figure is referred to as "the other side of the first direction x." In FIG. 1, the upper side in the figure is referred to as "one side of the second direction y," and the lower side in the figure is referred to as "the other side of the second direction y." In FIG. 4, the upper side in the figure is referred to as "one side of the thickness direction z," and the lower side in the figure is referred to as "the other side of the thickness direction z." The size of the semiconductor device A10 is not particularly limited. In the present embodiment, for example, the dimension of the first direction x is 2.6 mm to 3.6 mm, the dimension of the second direction y is 2.6 mm to 3.6 mm, and the dimension of the thickness direction z is 0.5 mm to 1.0 mm.

The first lead 1A, the second lead 1B, and the third lead 1C are formed, for example, by subjecting a metal plate to a punching process or a bending process. Constituent materials of the first lead 1A, the second lead 1B, and the third lead 1C are composed of, for example, either copper (Cu) or nickel (Ni), or an alloy thereof. The thicknesses of the first lead 1A, the second lead 1B, and the third lead 1C are, for example, 0.1 mm to 0.3 mm.

As shown in FIG. 3, the first lead 1A is arranged apart from the second lead 1B and the third lead 1C in the second direction y. The second lead 1B and the third lead 1C are arranged in the first direction x. The first lead 1A, the second lead 1B, and the third lead 1C are arranged apart from each other in the thickness direction z. The size of the first lead 1A is the largest and the size of the third lead 1C is the smallest when viewed in the thickness direction z.

As shown in FIGS. 3 to 6, the first lead 1A includes an element bonding portion 11 and a plurality of (four in the present embodiment) terminal-shaped extending portions 12. The element bonding portion 11 has a rectangular shape, for example, when viewed in the thickness direction z. The element bonding portion 11 has an element mounting surface 111 and a back surface mounting portion 112. The element mounting surface 111 faces one side of the thickness direction z, and the back surface mounting portion 112 faces a side opposite to the element mounting surface 111 (the other side of the thickness direction z). The semiconductor element 2 is mounted on the element mounting surface 111. As shown in FIGS. 2, 4, and the like, the back surface mounting portion 112 is exposed from the sealing resin 7. The back surface mounting portion 112 is a portion to be bonded by a bonding material such as solder when the semiconductor device A10 is mounted on a circuit board (not shown).

As shown in FIGS. 3 and 4, the second lead 1B includes a bonding portion 13, a plurality of (three in the present embodiment) terminal portions 14, and a plurality of (three in the present embodiment) bent portions 15. The bonding portion 13 is located on one side of the thickness direction z (the upper side of FIG. 4) to the plurality of terminal portions 14. Further, the bonding portion 13 is located inward in the second direction y to the plurality of terminal portions 14. Each of the plurality of terminal portions 14 includes a back surface mounting portion 141. The back surface mounting portion 141 faces the other side of the thickness direction z (a lower side of FIG. 4). The back surface mounting portion 141 is exposed from the sealing resin 7. The back surface mounting portion 141 is a portion to be bonded by a bonding material such as solder when the semiconductor device A10 is mounted on a circuit board (not shown). The plurality of bent portions 15 separately connect the bonding portion 13 and the plurality of terminal portions 14, respectively, and have a bent shape when viewed in the first direction x.

As shown in FIGS. 3 and 5, the third lead 1C includes a wire bonding portion 16, a terminal portion 17, and a bent portion 18. The wire bonding portion 16 is located on one side of the thickness direction z (an upper side of FIG. 5) to the terminal portion 17. Further, the wire bonding portion 16 is located inward in the second direction y to the terminal portion 17. The terminal portion 17 includes a back surface mounting portion 171. The back surface mounting portion 171 faces the other side of the thickness direction z (the lower side of FIG. 5). The back surface mounting portion 171 is exposed from the sealing resin 7. The back surface mounting portion 171 is a portion to be bonded by a bonding material such as solder when the semiconductor device A10 is mounted on a circuit board (not shown). The bent portion 18 connects the wire bonding portion 16 and the terminal portion 17, and has a bent shape when viewed in the first direction x.

The semiconductor element 2 is an element that exhibits an electrical function of the semiconductor device A10. The type of the semiconductor element 2 is not particularly limited. In the present embodiment, the semiconductor element 2 is configured as a transistor. As shown in FIGS. 3 to 5, the semiconductor element 2 includes an element main body 20, a first electrode 21, a second electrode 22, and a third electrode 23.

The element main body 20 has a rectangular shape when viewed in the thickness direction z. The element main body 20 has an element main surface 201 and an element back surface 202. The element main surface 201 and the element back surface 202 face opposite to each other in the thickness direction z. The element main surface 201 faces the same side as the element mounting surface 111 of the element bonding portion 11 in the thickness direction z. Therefore, the element back surface 202 faces the element mounting surface 111.

The first electrode 21 and the third electrode 23 are arranged on the element main surface 201. The second electrode 22 is arranged on the element back surface 202. The constituent materials of the first electrode 21, the second electrode 22, and the third electrode 23 are composed of, for example, either copper or aluminum (Al), or an alloy thereof. In the present embodiment, the first electrode 21 is a source electrode, the second electrode 22 is a drain electrode, and the third electrode 23 is a gate electrode.

In the present embodiment, the first electrode 21 covers most of the element main surface 201. Specifically, the first electrode 21 is arranged in a region of the rectangular element main surface 201 excluding the peripheral edge portion and one corner portion (a lower right corner portion of FIG. 3) of the element main surface 201. The first electrode 21 includes a first electrode pad 212. The first electrode pad 212 is located inside the insulator 3 when viewed in the thickness direction z. The third electrode 23 is arranged at one corner of the element main surface 201 (the lower right corner of FIG. 3). The second electrode 22 covers substantially an entire surface of the element back surface 202.

The second electrode 22 is electrically bonded to the element mounting surface 111 (the element bonding portion 11) via the second conductive bonding material 62. The second conductive bonding material 62 conductively bonds the element bonding portion 11 and the second electrode 22. The second conductive bonding material 62 is, for example, solder.

The semiconductor device A10 includes a wire 65. The wire 65 is electrically bonded to the third electrode 23 and the wire bonding portion 16 of the third lead 1C. The wire 65 conductively bonds the third electrode 23 and the third lead 1C.

As shown in FIGS. 7 and 8, the insulator 3 is arranged over the first electrode 21 and the element main surface 201. The insulator 3 has an annular shape that overlaps with the outer peripheral edge of the first electrode 21 when viewed in the thickness direction z. The outer end edge 301 of the insulator 3 is located near the outer peripheral edge of the element main surface 201 when viewed in the thickness direction z. In the first electrode 21, a region located inside an inner end edge 302 of the insulator 3 when viewed in the thickness direction z is referred to as the first electrode pad 212.

In the present embodiment, the insulator 3 is composed of a first insulating layer 31 and a second insulating layer 33. The first insulating layer 31 is arranged over the peripheral edge portion 211 of the first electrode 21 and the element main surface 201. In FIG. 7, a forming region of the first insulating layer 31 is shaded. The first insulating layer 31 is made of, for example, nitride such as SiN. The thickness of the first insulating layer 31 is, for example, 0.1 μm to 2 μm. Other insulating materials such as SiON and $SiO_2$ may be adopted as the constituent material of the first insulating layer 31.

The first insulating layer 31 includes a first annular portion 310. The first annular portion 310 has an annular shape corresponding to the outer peripheral edge of the first electrode 21. In the present embodiment, the first annular portion 310 is composed of a plurality of strip-shaped portions each extending in the first direction x or the second direction y with substantially a constant width. In the present embodiment, the first annular portion 310 has outer end edges 311, 312, 313, 314, 315, and 316 and inner end edges 321, 322, 323, 324, 325, and 326.

The outer end edge 311 is located on one side of the second direction y in the first annular portion 310 and extends in the first direction x. The outer end edge 312 is located on one side of the first direction x in the first annular portion 310 and extends in the second direction y. One side end of the outer end edge 312 in the second direction y is connected to one side end of the outer end edge 311 in the first direction x. The outer end edge 313 is located on the other side of the first direction x in the first annular portion 310 and extends in the second direction y. One side end of the outer end edge 313 in the second direction y is connected to the other side end of the outer end edge 311 in the first direction x. The outer end edge 314 is located on the other side of the second direction y in the first annular portion 310 and extends in the first direction x. The other side end of the outer end edge 314 in the first direction x is connected to the other side end of the outer end edge 313 in the second direction y. The outer end edge 311 and the outer end edge 314 correspond to a "first outer end edge" of the present disclosure. The outer end edge 312 and the outer end edge 313 correspond to a "second outer end edge" of the present disclosure.

The inner end edge 321 is located on one side of the second direction y in the first annular portion 310 and extends in the second direction y. The inner end edge 321 corresponds to the outer end edge 311 and is located inside the outer end edge 311 in the second direction y when viewed in the thickness direction z. The inner end edge 322 is located on one side of the first direction x in the first annular portion 310 and extends in the second direction y. One side end of the inner end edge 322 in the second direction y is connected to one side end of the inner end edge 321 in the first direction x. The inner end edge 322 corresponds to the outer end edge 312 and is located inside the outer end edge 312 in the first direction x when viewed in the thickness direction z. The inner end edge 323 is located on the other side of the first direction x in the first annular portion 310 and extends in the second direction y. One side end of the inner end edge 323 in the second direction y is connected to the other side end of the inner end edge 321 in the first direction x. The inner end edge 323 corresponds to the outer end edge 313 and is located inside the outer end edge 313 in the first direction x when viewed in the thickness direction z. The inner end edge 324 is located on the other side of the second direction y in the first annular portion 310 and extends in the first direction x. The other side end of the inner end edge 324 in the first direction x is connected to the other side end of the inner end edge 323 in the second direction y. The inner end edge 324 corresponds to the outer end edge 314 and is located inside the outer end edge 314 in the second direction y when viewed in the thickness direction z. The inner end edge 321 and the inner end edge 324 correspond to a "first inner end edge" of the present disclosure. The inner end edge 322 and the inner end edge 323 correspond to a "second inner end edge" of the present disclosure.

The inner end edge 325 is located near one side of the first direction x and near the other side of the second direction y in the first annular portion 310, and extends in the first direction x. One side end of the inner end edge 325 in the first direction x is connected to the other side end of the inner end edge 322 in the second direction y. The inner end edge 325 is located inside the inner end edge 322 in the first direction x when viewed in the thickness direction z. The inner end edge 326 is located near one side of the first direction x and near the other side of the second direction y in the first annular portion 310, and extends in the second direction y. The other side end of the inner end edge 326 in the second direction y is connected to the other side end of the inner end edge 325 in the first direction x. The inner end edge 326 is located on the side opposite to the inner end edge 321 to the inner end edge 325 in the second direction y when viewed in the thickness direction z. Further, in the present embodiment, the inner end edge 326 is also connected to the inner end edge 324. The inner end edge 325 corresponds to a "fifth inner end edge" of the present disclosure. The inner end edge 326 corresponds to a "sixth inner end edge" of the present disclosure.

The outer end edge 315 is located near one side of the first direction x and near the other side of the second direction y in the first annular portion 310, and extends in the first direction x. One side end of the outer end edge 315 in the first direction x is connected to the other side end of the outer end edge 312 in the second direction y. The outer end edge 315 corresponds to the inner end edge 325 and is located outside the inner end edge 325 in the second direction y when viewed in the thickness direction z. The outer end edge 316 is located near one side of the first direction x and near the other side of the second direction y in the first annular portion 310, and extends in the second direction y. The other side end of the outer end edge 316 in the second direction y is connected to the other side end of the outer end edge 315 in the first direction x. The outer end edge 316 corresponds to the inner end edge 326 and is located outside the inner end edge 326 in the first direction x in the thickness direction z. Further, in the present embodiment, the outer end edge 316 is also connected to the outer end edge 314. The outer end edge 315 corresponds to a "fifth outer end edge" of the present disclosure. The outer end edge 316 corresponds to a "sixth outer end edge" of the present disclosure.

As shown in FIGS. 7 and 8, the second insulating layer 33 is laminated on the first insulating layer 31. In the present embodiment, the second insulating layer 33 covers the entire first insulating layer 31 and a portion of each of the first electrode 21 and the element main surface 201. In the present embodiment, the second insulating layer 33 shown in FIG. 8 includes the outer end edge 301 and the inner end edge 302 in the insulator 3.

The constituent material of the second insulating layer 33 is not particularly limited. In the present embodiment, the second insulating layer 33 is made of, for example, a resin material such as a polyimide resin. The thickness of the second insulating layer 33 is larger than the thickness of the first insulating layer 31. Preferably, the thickness of the second insulating layer 33 is 5 to 50 times the thickness of the first insulating layer 31. The thickness of the second insulating layer 33 is, for example, 5 μm to 10 μm.

As shown in FIG. 7, the second insulating layer 33 includes a second annular portion 330. The second annular portion 330 has an annular shape corresponding to the first annular portion 310, and covers the entire first annular portion 310. In the present embodiment, the second annular portion 330 is composed of a plurality of strip-shaped portions each extending in the first direction x or the second direction y. In the present embodiment, the second annular portion 330 has outer end edges 331, 332, 333, 334, 335, and 336 and inner end edges 341, 342, 343, 344, 345, and 346.

The outer end edge 331 is located on one side of the second direction y in the second annular portion 330 and extends in the first direction x. The outer end edge 331 is located outside the outer end edge 311 in the second direction y when viewed in the thickness direction z.

The outer end edge 332 is located on one side of the first direction x in the second annular portion 330 and extends in the second direction y. One side end of the outer end edge 332 in the second direction y is connected to one side end of the outer end edge 331 in the first direction x. The outer end edge 332 is located outside the outer end edge 312 in the first direction x when viewed in the thickness direction z.

As shown in FIG. 9, in the present embodiment, the outer end edge 331 includes an outer end edge first portion 331A and an outer end edge overhanging portion 331E. The outer end edge first portion 331A extends linearly along the first direction x and occupies most of the outer end edge 331 except for the end portion thereof. The outer end edge overhanging portion 331E is connected to the outer end edge first portion 331A and is located at the end portion near the outer end edge 332. The outer end edge overhanging portion 331E is located outside the outer end edge first portion 331A in the second direction y. Therefore, in the outer end edge 331, the end portion (the outer end edge overhanging portion 331E) near the outer end edge 332 protrudes outward in the second direction y as compared with the center of the first direction x (the outer end edge first portion 331A).

The outer end edge 332 includes an outer end edge first portion 332A and an outer end edge overhanging portion 332E. The outer end edge first portion 332A extends linearly along the second direction y and occupies most of the outer end edge 332 except for the end portion thereof. The outer end edge overhanging portion 332E is connected to the outer end edge first portion 332A and is located at the end portion near the outer end edge 331. The outer end edge overhanging portion 332E is located outside the outer end edge first portion 332A in the first direction x. Therefore, in the outer end edge 332, the end portion (the outer end edge overhanging portion 332E) near the outer end edge 331 protrudes outward in the first direction x as compared with the center of the second direction y (the outer end edge first portion 332A). Further, the outer end edge overhanging portion 332E is also connected to the outer end edge overhanging portion 331E. In FIG. 9, a two-dot chain line inclined at an angle of 45° to the first direction x and the second direction y indicates a boundary between the outer end edge overhanging portion 331E and the outer end edge overhanging portion 332E. As a result, the corner portion (the outer end edge overhanging portion 331E and the outer end edge overhanging portion 332E) of the outer end edge 331 and the outer end edge 332 has a shape protruding outward in both the first direction x and the second direction y.

As shown in FIG. 7, the outer end edge 333 is located on the other side of the first direction x in the second annular portion 330 and extends in the second direction y. One side end of the outer end edge 313 in the second direction y is connected to the other side end of the outer end edge 311 in the first direction x. The outer end edge 333 is located outside the outer end edge 313 in the first direction x when viewed in the thickness direction z.

Although detailed illustration and description are omitted, in the outer end edge 333, the end portion near the outer end edge 331 protrudes outward in the first direction x as compared with the center of the second direction y. As a result, the corner portion of the outer end edge 331 and the outer end edge 333 (the upper left corner portion in FIG. 7) has a shape that protrudes outward in both the first direction x and the second direction y, similarly to the corner portion of the outer end edge 331 and the outer end edge 332.

The outer end edge 334 is located on the other side of the second direction y in the second annular portion 330 and extends in the first direction x. The other side end of the outer end edge 334 in the first direction x is connected to the other side end of the outer end edge 333 in the second direction y. The outer end edge 334 is located outside the outer end edge 314 in the second direction y when viewed in the thickness direction z.

Although detailed illustration and description are omitted, in the outer end edge 334, the end portion near the outer end edge 333 protrudes outward in the second direction y as compared with the center of the first direction x. Further, in the outer end edge 333, the end portion near the outer end edge 334 protrudes outward in the first direction x as compared with the center of the second direction y. The end portion of the outer end edge 334 near the outer end edge 333 is connected to the end portion of the outer end edge 333 near the outer end edge 334. As a result, the corner portion of the outer end edge 333 and the outer end edge 334 (the lower left corner in FIG. 7) has a shape that protrudes outward in both the first direction x and the second direction y, similarly to the corner portion of the outer end edge 331 and the outer end edge 332. The outer end edge 331 and the outer end edge 334 correspond to a "third outer end edge" of the present disclosure. The outer end edge 332 and the outer end edge 333 correspond to a "fourth outer end edge" of the present disclosure.

The inner end edge 341 is located on one side of the second direction y in the second annular portion 330 and extends in the second direction y. The inner end edge 341 is located inside the inner end edge 321 in the second direction y when viewed in the thickness direction z. The inner end edge 342 is located on one side of the first direction x in the second annular portion 330 and extends in the second direction y. One side end of the inner end edge 342 in the second direction y is connected to one side end of the inner end edge 341 in the first direction x. The inner end edge 342 is located inside the inner end edge 322 in the first direction x when viewed in the thickness direction z. The inner end edge 343 is located on the other side of the first direction x in the second annular portion 330 and extends in the second direction y. One side end of the inner end edge 343 in the second direction y is connected to the other side end of the inner end edge 341 in the first direction x. The inner end edge 343 is located inside the inner end edge 323 in the first direction x when viewed in the thickness direction z. The inner end edge 344 is located on the other side of the second direction y in the second annular portion 330 and extends in the first direction x. The other side end of the inner end edge 344 in the first direction x is connected to the other side end of the inner end edge 343 in the second direction y. The inner end edge 344 is located inside the inner end edge 324 in the second direction y when viewed in the thickness direction z. The inner end edge 341 and the inner end edge 344 correspond to a "third inner end edge" of the present disclosure. The inner end edge 342 and the inner end edge 343 correspond to a "fourth inner end edge" of the present disclosure.

The inner end edge 345 is located near one side of the first direction x and near the other side of the second direction y in the second annular portion 330, and extends in the first direction x. One side end of the inner end edge 345 in the first direction x is connected to the other side end of the inner end edge 342 in the second direction y. The inner end edge 345 is located inside the inner end edge 325 in the second direction y when viewed in the thickness direction z. The inner end edge 346 is located near one side of the first direction x and near the other side of the second direction y in the second annular portion 330, and extends in the second direction y. The other side end of the inner end edge 346 in the second direction y is connected to the other side end of the inner end edge 345 in the first direction x. The inner end edge 346 is located inside the inner end edge 326 in the first direction x when viewed in the thickness direction z. Further, in the present embodiment, the inner end edge 346 is also connected to the inner end edge 344.

As shown in FIG. 10, in the present embodiment, the inner end edge 345 includes an inner end edge first portion 345A and an inner end edge overhanging portion 345E. The inner end edge first portion 345A extends linearly along the first direction x and occupies most of the inner end edge 345 except for the end portion thereof. The inner end edge overhanging portion 345E is connected to the inner end edge first portion 345A and is located at the end portion near the inner end edge 346. The inner end edge overhanging portion 345E is located inside the inner end edge overhanging portion 345E in the second direction y. Therefore, in the inner end edge 345, the end portion (the inner end edge overhanging portion 345E) near the inner end edge 346 protrudes inward in the second direction y as compared with the center of the first direction x (the inner end edge first portion 345A).

The inner end edge 346 includes an inner end edge first portion 346A and an inner end edge overhanging portion 346E. The inner end edge first portion 346A extends linearly along the second direction y and occupies most of the inner end edge 346 except for the end portion thereof. The inner end edge overhanging portion 346E is connected to the inner end edge first portion 346A and is located at the end portion near the inner end edge 345. The inner end edge overhanging portion 346E is located inside the inner end edge first portion 346A in the first direction x. Therefore, in the inner end edge 346, the end portion (the inner end edge overhanging portion 346E) near the inner end edge 345 protrudes inward in the first direction x as compared with the center of the second direction y (the inner end edge first portion 346A). Further, the inner end edge overhanging portion 346E is also connected to the inner end edge overhanging portion 345E. In FIG. 10, a two-dot chain line inclined at an angle of 45° to the first direction x and the second direction y indicates a boundary between the inner end edge overhanging portion 345E and the inner end edge overhanging portion 346E. As a result, the corner portion (the inner end edge overhanging portion 345E and the inner end edge overhanging portion 346E) of the inner end edge 345 and the inner end edge 346 has a shape that protrudes inward in both the first direction x and the second direction y. The inner end edge 345 corresponds to a "seventh inner end edge" of the present disclosure. The inner end edge 346 corresponds to an "eighth inner end edge" of the present disclosure.

As shown in FIG. 7, the outer end edge 335 is located near one side of the first direction x and near the other side of the second direction y in the second annular portion 330, and extends in the first direction x. One side end of the outer end edge 335 in the first direction x is connected to the other side end of the outer end edge 332 in the second direction y. The outer end edge 335 is located outside the outer end edge 315 in the second direction y when viewed in the thickness direction z. The outer end edge 336 is located near one side of the first direction x and near the other side of the second direction y in the second annular portion 330, and extends in the second direction y. The other side end of the outer end edge 336 in the second direction y is connected to the other side end of the outer end edge 335 in the first direction x. The outer end edge 336 is located outside the outer end edge 316 in the first direction x when viewed in the thickness direction z. Further, in the present embodiment, the outer end edge 336 is also connected to the outer end edge 334. The outer end edge 335 corresponds to a "seventh outer end edge" of the present disclosure. The outer end edge 336 corresponds to an "eighth outer end edge" of the present disclosure.

As shown in FIGS. 7 and 8, the metal laminated portion 4 is arranged over the first electrode 21 and the insulator 3, and has a structure in which a plurality of metal layers are laminated. In the present embodiment, the metal laminated portion 4 includes a first metal layer 41, a second metal layer 42, and a third metal layer 43.

The first metal layer 41 is arranged over the first electrode 21 and the insulator 3 (the second insulating layer 33). Specifically, the first metal layer 41 covers the first electrode pad 212 of the first electrode 21, which is located inside the inner end edge 302 of the insulator 3 (the second insulating layer 33) when viewed in the thickness direction z, and a portion of the second insulating layer 33 (the second annular portion 330). The first metal layer 41 includes a first extending portion 411 located on the outer peripheral portion when viewed in the thickness direction z. A first end edge 412, which is the outer peripheral edge of the first metal layer 41, is located between the outer end edge 301 and the inner end edge 302 of the insulator 3 (the second insulating layer 33) when viewed in the thickness direction z. The constituent material of the first metal layer 41 includes titanium (Ti). The thickness of the first metal layer 41 is, for example, 0.1 µm to 0.5 µm.

The second metal layer 42 is laminated on the first metal layer 41. The second metal layer 42 overlaps both the first electrode 21 and the insulator 3 when viewed in the thickness direction z. The second metal layer 42 covers a region located inside the first extending portion 411 except for the outer peripheral portion (the first extending portion 411) of the first metal layer 41 when viewed in the thickness direction z. As a result, the first extending portion 411 of the first metal layer 41 is not covered with the second metal layer 42, but is exposed from the second metal layer 42. The second metal layer 42 includes a second extending portion 421 located on the outer peripheral portion when viewed in the thickness direction z. A second edge 422, which is the outer peripheral edge of the second metal layer 42, is located between the first end edge 412 of the first metal layer 41 and the inner end edge 302 of the insulator 3 (the second insulating layer 33) when viewed in the thickness direction z. The constituent material of the second metal layer 42 includes nickel. The thickness of the second metal layer 42 is, for example, 0.1 µm to 0.5 µm.

The third metal layer 43 is laminated on the second metal layer 42. The third metal layer 43 overlaps both the first electrode 21 and the insulator 3 when viewed in the thickness direction z. The third metal layer 43 covers a region located inside the second extending portion 421 except for the outer peripheral portion (the second extending portion 421) of the second metal layer 42 when viewed in the thickness direction z. As a result, the second extending portion 421 of the second metal layer 42 is not covered with the third metal layer 43, but is exposed from the third metal layer 43. A third end edge 431, which is the outer peripheral edge of the third metal layer 43, is located between the second end edge 422 of the second metal layer 42 and the inner end edge 302 of the insulator 3 (the second insulating layer 33) when viewed in the thickness direction z. The constituent material of the second metal layer 42 includes silver (Ag). The thickness of the third metal layer 43 is larger than either the thickness of the first metal layer 41 or the thickness of the second metal layer 42. The thickness of the third metal layer 43 is, for example, 0.5 µm to 1.5 µm.

As can be seen from FIG. 8 and the above description, the second end edge 422 of the second metal layer 42 is located closer to the inner end edge 302 of the insulator 3 (the second insulating layer 33) than the first end edge 412 of the first metal layer 41. The third end edge 431 of the third metal layer 43 is located closer to the inner end edge 302 than the second end edge 422 of the second metal layer 42. As a result, the first metal layer 41, the second metal layer 42, and the third metal layer 43 are laminated in a stepped manner. In the configuration shown in FIG. 8, when viewed in the thickness direction z, the first dimension L1, which is a distance between the first end edge 412 and the second end edge 422, is, for example, 10 to 50 times the thickness of the first metal layer 41. When viewed in the thickness direction z, the second dimension L2, which is a distance between the second end edge 422 and the third end edge 431, is, for example, 10 to 50 times the thickness of the second metal layer 42. When viewed in the thickness direction z, the third dimension L3, which is a distance between the third end edge 431 and the inner end edge 302, is, for example, 1 to 5 times the thickness of the third metal layer 43.

As shown in FIGS. 3 and 4, the conductive member 5 is bonded to the first electrode 21 of the semiconductor element 2, and the second lead 1B. The conductive member 5 is made of a metal plate material. The metal is copper or a copper alloy. The conductive member 5 is a metal plate material that has been punched or bent. In the present embodiment, the conductive member 5 includes an element side bonding portion 51, a lead side bonding portion 52, and an intermediate portion 53. As shown in FIG. 4, the element side bonding portion 51, the lead side bonding portion 52, and the intermediate portion 53 are appropriately bent and connected when viewed in the first direction x.

The element side bonding portion 51 is bonded to the first electrode pad 212 of the first electrode 21 via the first conductive bonding material 61. The first conductive bonding material 61 conductively bonds the element side bonding portion 51 (the conductive member 5) and the first electrode pad 212. The first conductive bonding material 61 is, for example, solder.

As shown in FIGS. 4 to 6, a protruding portion 511 and a concave portion 512 are formed in the element side bonding portion 51. The protruding portion 511 protrudes downward (the other side of the thickness direction z) from the lower surface of the element side bonding portion 51 (a surface facing the element main surface 201). In the illustrated example, two protruding portions 511 are provided at an interval in the second direction y, and each protruding portion 511 extends in the first direction x with a constant width. The concave portion 512 is a portion that is partially recessed upward (one side of the thickness direction z) from the lower surface of the element side bonding portion 51. In the illustrated example, two concave portions 512 are provided at an interval in the first direction x, and each concave portion 512 extends in the second direction y with a constant width.

At the time of bonding the first electrode pad 212 and the element side bonding portion 51, while the protruding portion 511 is pressed against the first electrode pad 212 side, a sufficient amount of first conductive bonding material 61 is present around the protruding portion 511. As a result, the conduction between the element side bonding portion 51 and the first electrode pad 212 is appropriately maintained. Further, the concave portion 512 is provided on the lower surface of the element side bonding portion 51. As a result, even if voids (vacancy) are present in the first conductive bonding material 61, the voids can be accommodated in the concave portion 512. Therefore, the voids in the first conductive bonding material 61 can be suppressed. Instead of the illustrated concave portion 512, a through-hole may be formed through the element side bonding portion 51 in the thickness direction z in order to suppress the voids.

The lead side bonding portion 52 is bonded to the bonding portion 13 of the second lead 1B via the third conductive bonding material 63. The third conductive bonding material 63 conductively bonds the lead side bonding portion 52 (the conductive member 5) and the bonding portion 13 (the second lead 1B). The third conductive bonding material 63 is, for example, solder. As shown in FIG. 4, the lead side bonding portion 52 includes a convex portion located on the other side (the lower side of the figure) of the thickness direction z from the periphery. At the time of bonding the bonding portion 13 and the lead side bonding portion 52, while the convex portion is pressed against the bonding portion 13, a sufficient amount of third conductive bonding material 63 is present around the convex portion. As a result, the conduction between the lead side bonding portion 52 and the bonding portion 13 is appropriately maintained.

The intermediate portion 53 is located between the element side bonding portion 51 and the lead side bonding portion 52 in the second direction y. The intermediate portion 53 is connected to both the element side bonding portion 51 and the lead side bonding portion 52.

The sealing resin 7 covers a portion of each of the first lead 1A, the second lead 1B, and the third lead 1C, the semiconductor element 2, the insulator 3, the metal laminated portion 4, the conductive member 5, and the wire 65. The sealing resin 7 is made of, for example, a black epoxy resin.

As shown in FIGS. 1, 2, 4, and 6, the sealing resin 7 has a sealing resin main surface 71, a sealing resin back surface 72, and a sealing resin side surface 73. The sealing resin main surface 71 and the sealing resin back surface 72 face opposite sides in the thickness direction z. The sealing resin main surface 71 faces the same side as the element main surface 201 and the element mounting surface 111. The sealing resin back surface 72 faces the same side as the element back surface 202 and the back surface mounting portion 112. The sealing resin side surface 73 is connected to the sealing resin main surface 71 and the sealing resin back surface 72, and is slightly inclined to the thickness direction z.

Next, an example of a method of manufacturing the semiconductor device A10 will be described below with reference to FIGS. 11 to 29. FIGS. 12, 14, 16, and 20 to 29 each of which is a cross-sectional view showing one step of the method of manufacturing the semiconductor device A10 and is the same cross-sectional view as the partially enlarged cross-sectional view shown in FIG. 8.

Figure 11:
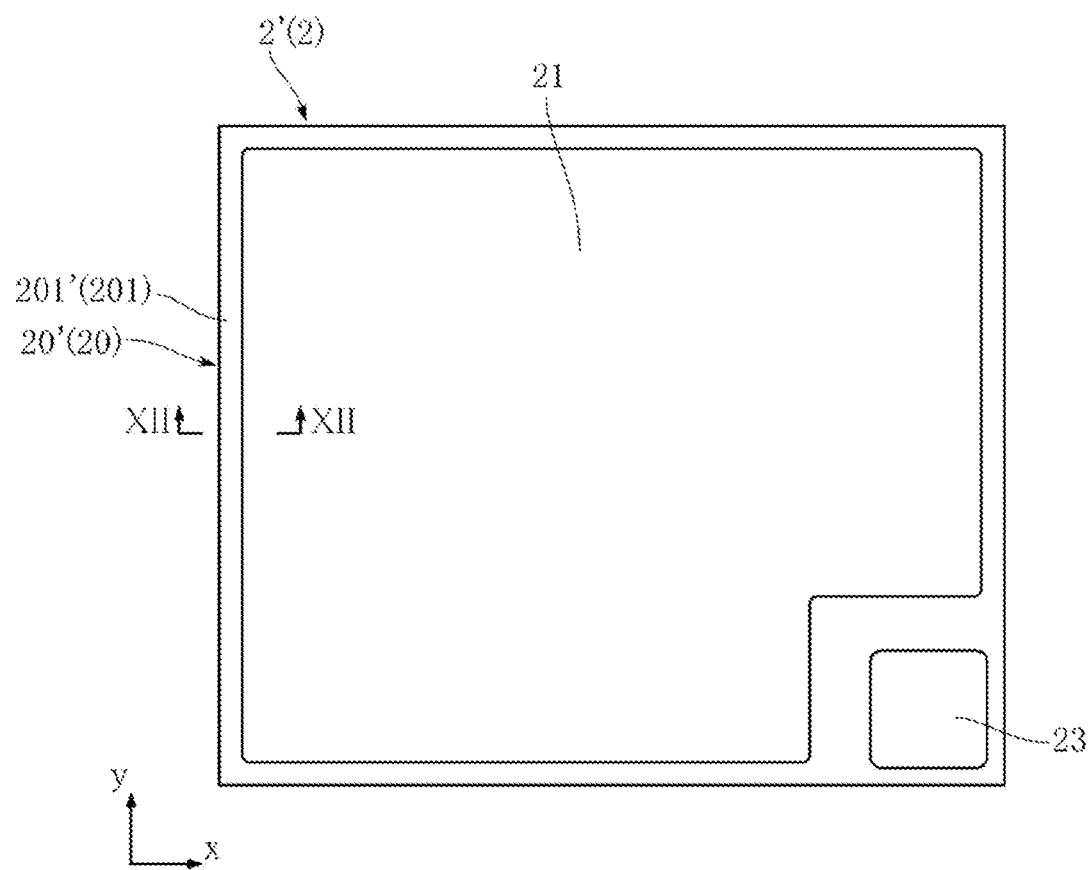
FIG. 11 is a plan view showing one step of an example of a method for manufacturing a semiconductor device according to the first embodiment of the present disclosure.
Figure 12:
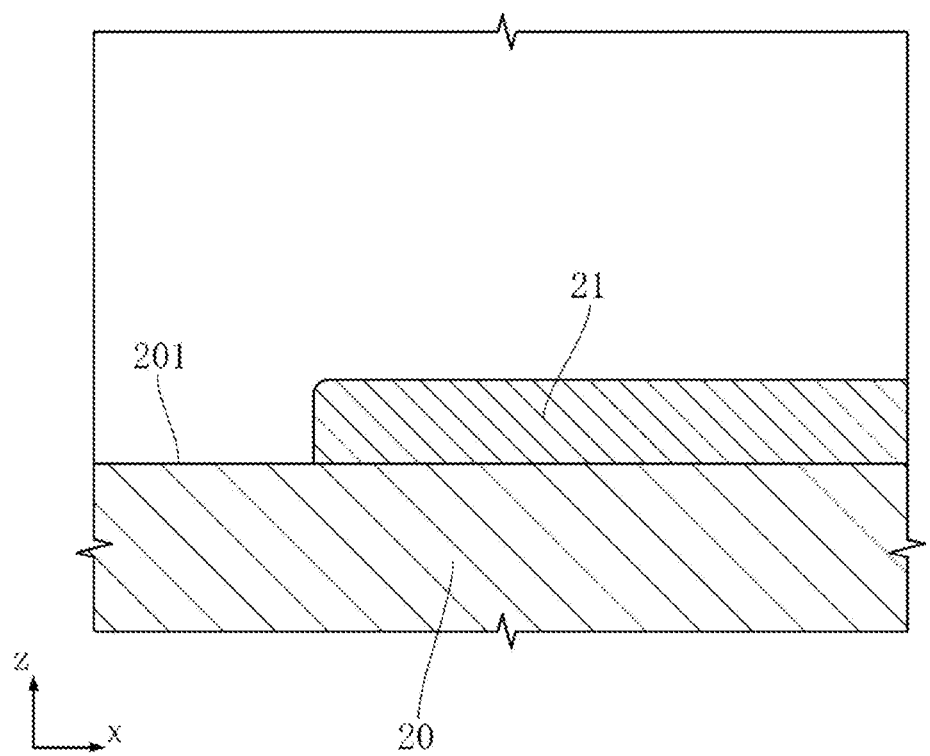
FIG. 12 is an enlarged cross-sectional view taken along line XII-XII of FIG. 11.

First, as shown in FIG. 11, a substrate 2' is prepared. The substrate 2' includes a base material 20', a first electrode 21, and a third electrode 23. The base material 20' is a member that becomes the element main body 20 of the semiconductor element 2. In the present embodiment, the base material 20' has a size that can be divided into a plurality of element main bodies 20 (the semiconductor element 2), for example, by cutting the base material 20' (the substrate 2') in a subsequent step. In the plan views after FIG. 11, a region corresponding to one element main body 20 (the semiconductor element 2) to be divided is shown. The base material 20' has a main surface 201'. The main surface 201' faces one side of the thickness direction z. The first electrode 21 and the third electrode 23 are arranged on the main surface 201'. Although not shown, a plurality of first electrodes 21 and a plurality of third electrodes 23 are arranged on the main surface 201' with a distance in each of the first direction x and the second direction y. In the plan views after FIG. 11, a region corresponding to the element main surface 201 of one element main body 20 (the semiconductor element 2) to be divided is represented as the main surface 201'. This step corresponds to a "step of preparing a substrate" of the present disclosure. In addition, unlike the example shown in FIG. 11, when the semiconductor element 2 including a single element main body 20 corresponding to the base material 20' is prepared as the substrate 2', it also corresponds to the "step of preparing a substrate" of the present disclosure.

Figure 13:
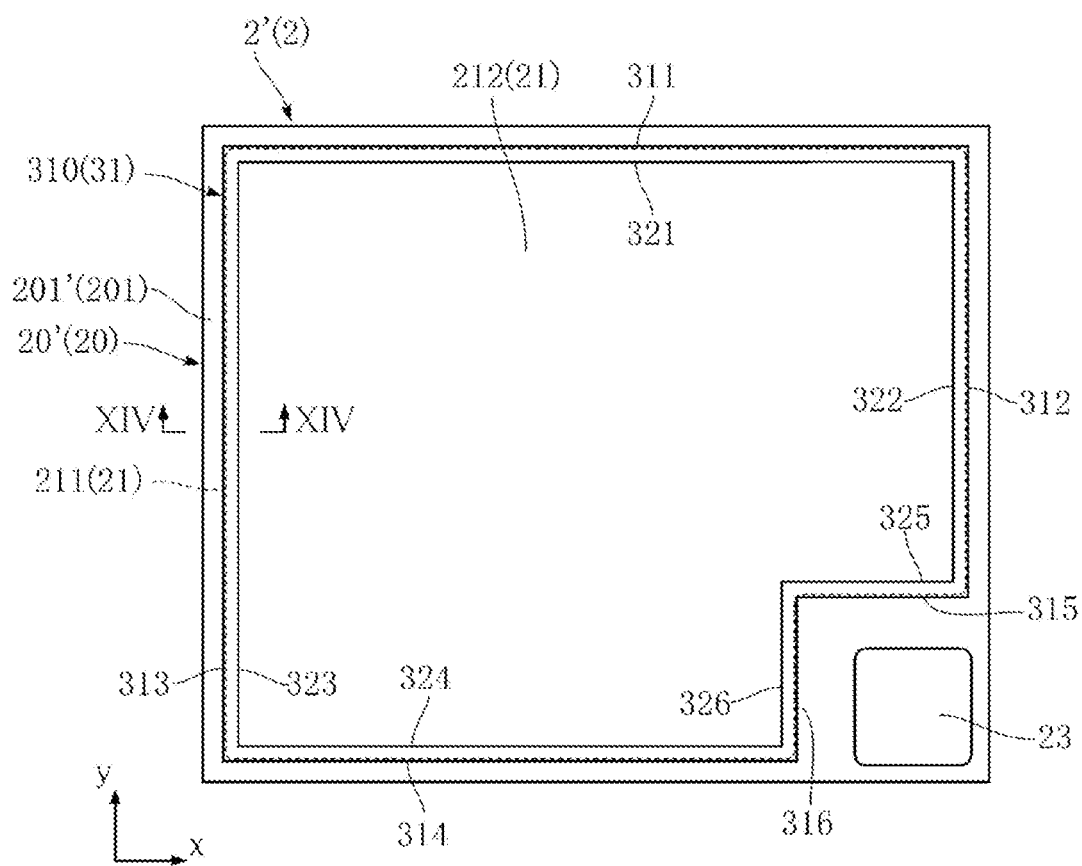
FIG. 13 is a plan view showing a step following FIG. 11.
Figure 14:
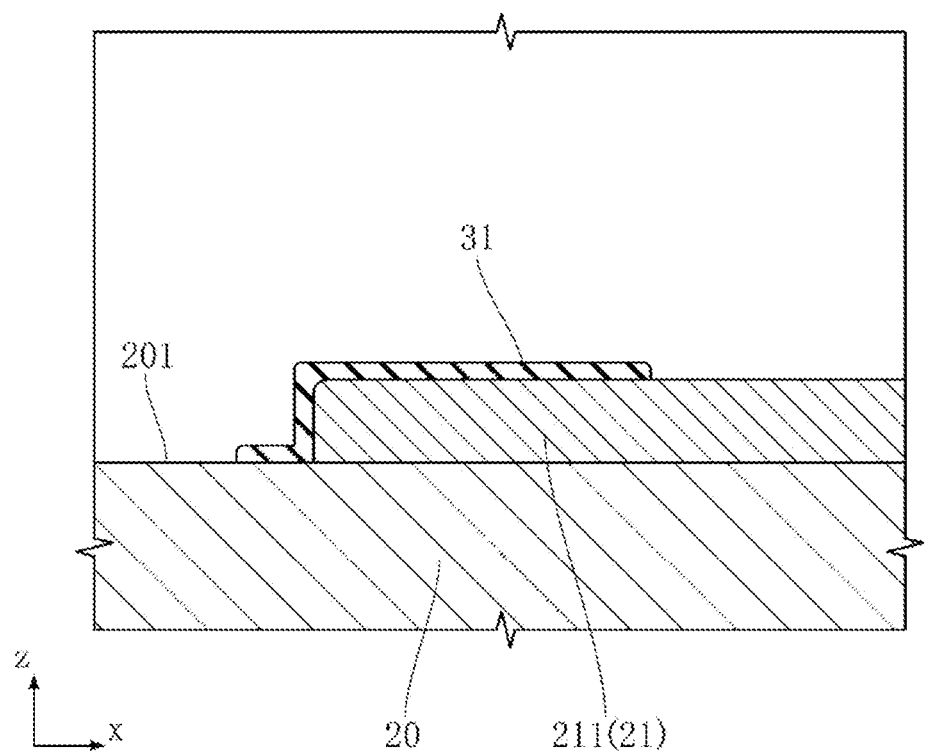
FIG. 14 is an enlarged cross-sectional view taken along line XIV-XIV of FIG. 13.

Next, as shown in FIG. 13, the first insulating layer 31 is formed on the main surface 201' side of the substrate 2'. The first insulating layer 31 can be formed by, for example, a thin film forming technique such as CVD (chemical vapor deposition). In the formation of the first insulating layer 31, for example, a mask having an opening corresponding to the first annular portion 310 is arranged on the substrate 2' to form a thin film made of SiN, and then the mask is removed. As a result, the first insulating layer 31 including the first annular portion 310 is formed. Here, the first annular portion 310 is arranged over the peripheral edge portion 211 of the first electrode 21, and the main surface 201'. The first annular portion 310 has outer end edges 311, 312, 313, 314, 315, and 316 and inner end edges 321, 322, 323, 324, 325, and 326, similar to the configuration described with reference to FIG. 7.

Figure 15:
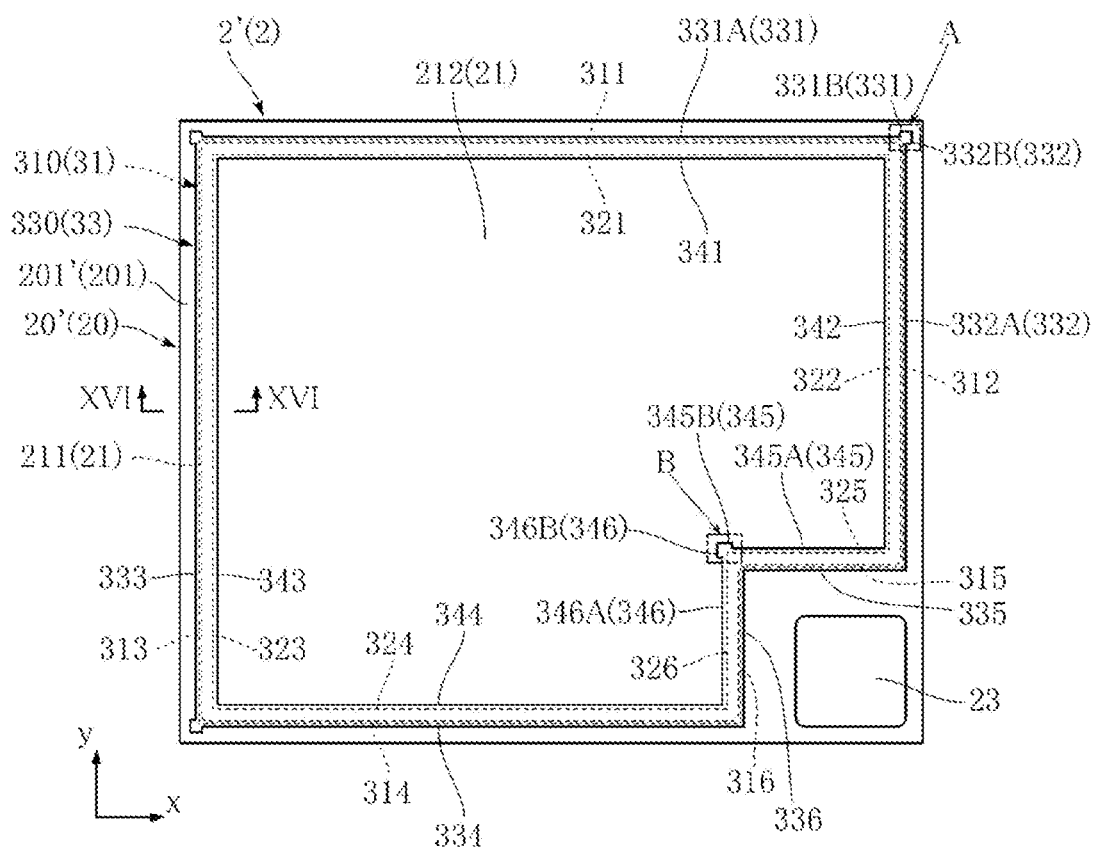
FIG. 15 is a plan view showing a step following FIG. 13.
Figure 16:
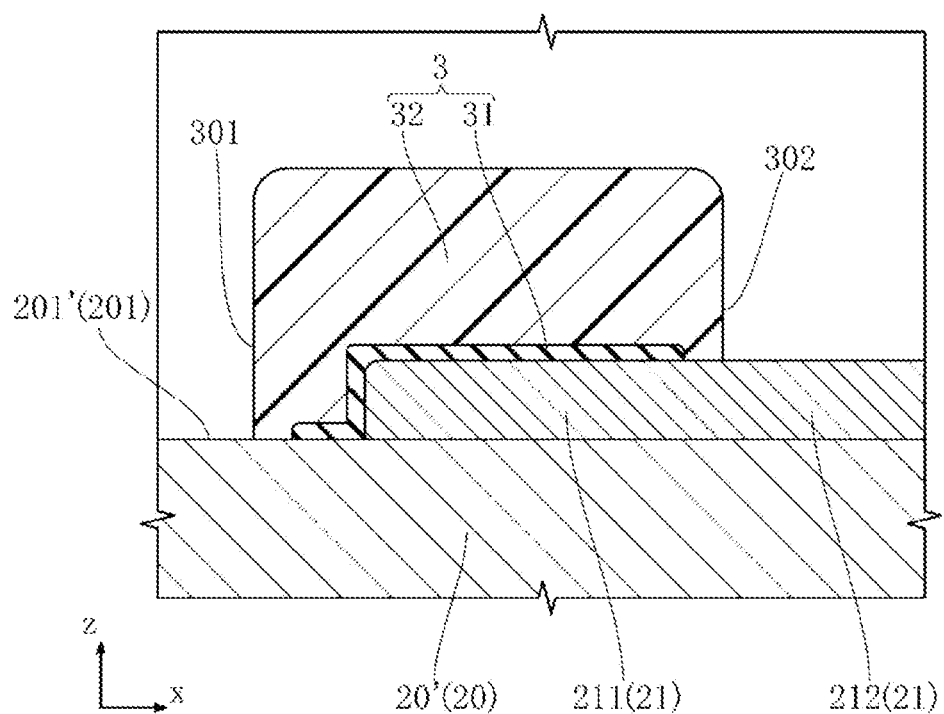
FIG. 16 is an enlarged cross-sectional view taken along line XVI-XVI of FIG. 15.

Next, as shown in FIG. 15, the second insulating layer 33 is formed on the main surface 201' side of the substrate 2'. The formation of the second insulating layer 33 can be performed, for example by arranging a polyamic acid (resin material) by coating, and heating it. In the formation of the second insulating layer 33, for example, a mask having an opening corresponding to the second annular portion 330 is first arranged on the substrate 2', the polyamic acid (resin material) is coated on the mask, and then the mask is removed. As a result, the second annular portion 330 made of a resin material is arranged. The second annular portion 330 overlaps with the first annular portion 310 when viewed in the thickness direction z. Here, the second annular portion 330 has outer end edges 331, 332, 333, 334, 335, and 336 and inner end edges 341, 342, 343, 344, 345, and 346. The second annular portion 330 is similar to the configuration described with reference to FIG. 7. On the other hand, the second annular portion 330 shown in FIG. 15 is different from the configuration shown in FIG. 7 in the shape of the corner portion of the outer end edge 331 and the outer end edge 332 (the upper right corner portion of FIG. 15), the shape of the corner portion of the outer end edge 331 and the outer end edge 333 (the upper left corner of FIG. 15), the shape of the corner portion of the outer end edge 333 and the outer end edge 334 (the lower left corner of FIG. 15), and the shape of the corner portion of the inner end edge 345 and the inner end edge 346.

Figure 17:
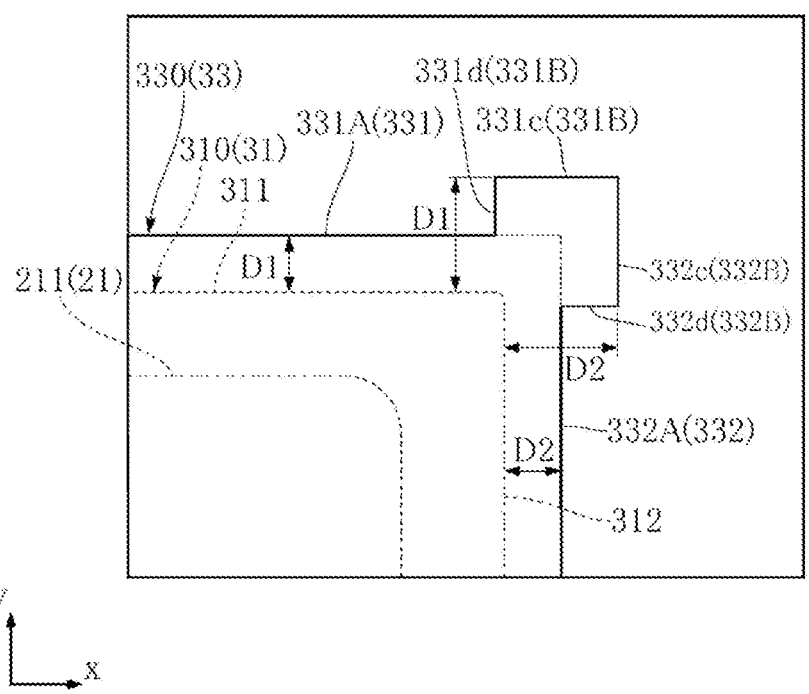
FIG. 17 is an enlarged view of a portion A of FIG. 15.

As shown in FIG. 17, the outer end edge 331 includes an outer end edge first portion 331A and an outer end edge second portion 331B. The outer end edge second portion 331B is connected to the outer end edge first portion 331A and is located at the end portion near the outer end edge 332. The outer end edge second portion 331B is located outside the outer end edge first portion 331A in the second direction y. In the illustrated example, the outer end edge second portion 331B has an outer end edge straight line portion 331c and an outer end edge connecting portion 331d. The outer end edge straight line portion 331c extends linearly along the first direction x. The outer end edge connecting portion 331d is connected to both the outer end edge first portion 331A and the outer end edge straight line portion 331c. Therefore, with respect to the outer end edge 311 of the first annular portion 310 and the outer end edge 331 of the second annular portion 330, a distance (first distance D1) between the outer end edge 311 and the outer end edge 331 in the second direction y is set to be larger at the end portion near the outer end edge 332 than the center of the first direction x. The first distance D1 is not particularly limited. In the present embodiment, for example, the first distance D1 at the center of the first direction x (a distance between the outer end edge 311 and the outer end edge first portion 331A in the second direction y) is about 10 μm to 20 μm, and the first distance D1 at the end portion near the outer end edge 332 (a distance between the outer end edge 311 and the outer end edge straight line portion 331c in the second direction y) is about 15 μm to 35 μm.

The outer end edge 332 includes an outer end edge first portion 332A and an outer end edge second portion 332B. The outer end edge second portion 332B is connected to both the outer end edge first portion 332A and the outer end edge straight line portion 331c (the outer end edge second portion 331B) and is located at the end portion near the outer end edge 331. The outer end edge second portion 332B is located outside the outer end edge first portion 332A in the first direction x. In the illustrated example, the outer end edge second portion 332B includes an outer end edge straight line portion 332c and an outer end edge connecting portion 332d. The outer end edge straight line portion 332c extends linearly along the second direction y. The outer end edge connecting portion 332d is connected to both the outer end edge first portion 332A and the outer end edge straight line portion 332c. Therefore, with respect to the outer end edge 312 of the first annular portion 310 and the outer end edge 332 of the second annular portion 330, a distance (second distance D2) between the outer end edge 312 and the outer end edge 332 in the first direction x is set to be larger at the end portion near the outer end edge 331 than the center of the second direction y. The second distance D2 is not particularly limited. In the present embodiment, for example, the second distance D2 at the center of the second direction y (a distance between the outer end edge 312 and the outer end edge first portion 332A in the first direction x) is about 10 μm to 20 μm, and the second distance D2 at the end portion near the outer end edge 331 (a distance between the outer end edge 312 and the outer end edge straight line portion 332c in the first direction x) is about 15 μm to 35 μm.

Further, the outer end edge second portion 332B is also connected to the outer end edge second portion 331B. As a result, the corner portion (the outer end edge second portion 331B and the outer end edge second portion 332B) of the outer end edge 331 and the outer end edge 332 has a shape that protrudes outward in both the first direction x and the second direction y. The corner portion (the outer end edge second portion 331B and the outer end edge second portion 332B) of the outer end edge 331 and the outer end edge 332 shown in FIG. 17 protrudes outward from the corner portion (the outer end edge overhanging portion 331E and the outer end edge overhanging portion 332E) of the outer end edge 331 and the outer end edge 332 shown in FIG. 9.

Although detailed illustration and description are omitted, the end portion of the outer end edge 331 near the outer end edge 333 is located on the outside in the second direction y, similarly to the end portion (the outer end edge second portion 331B) of the outer end edge 331 near the outer end edge 332. Further, the end portion of the outer end edge 333 near the outer end edge 331 is located on the outside in the first direction x, similarly to the end portion (the outer end edge second portion 332B) of the outer end edge 332 near the outer end edge 331. As a result, the corner portion of the outer end edge 331 and the outer end edge 333 (the upper left corner of FIG. 15) has a shape that protrudes outward in both the first direction x and the second direction y, similarly to the corner portion of the outer end edge 331 and the outer end edge 332.

Although detailed illustration and description are omitted, the end portion of the outer end edge 334 near the outer end edge 333 is located on the outside in the second direction y, similarly to the end portion (the outer end edge second portion 331B) of the outer end edge 331 near the outer end edge 332. Further, the end portion of the outer end edge 333 near the outer end edge 334 is located on the outside in the first direction x, similarly to the end portion (the outer end edge second portion 332B) of the outer end edge 332 near the outer end edge 331. As a result, the corner portion of the outer end edge 333 and the outer end edge 334 (the lower left corner of FIG. 15) has a shape that protrudes outward in both the first direction x and the second direction y, similarly to the corner portion of the outer end edge 331 and the outer end edge 332.

Figure 18:
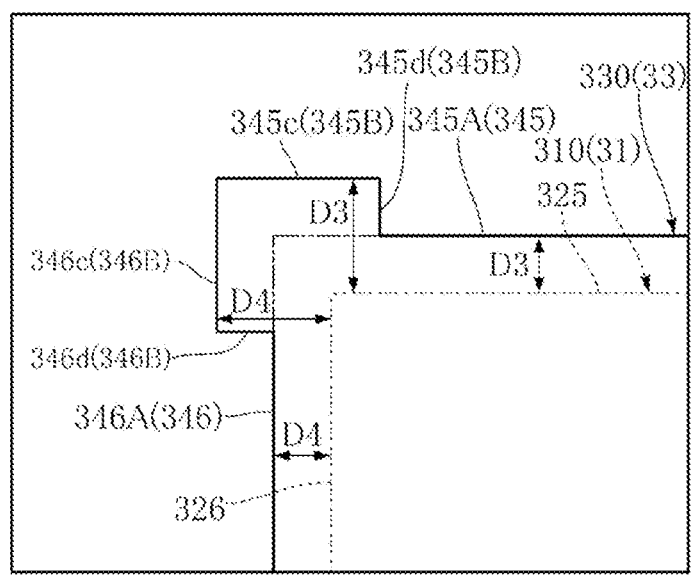
FIG. 18 is an enlarged view of a portion B in FIG. 15.

As shown in FIG. 18, the inner end edge 345 includes an inner end edge first portion 345A and an inner end edge second portion 345B. The inner end edge second portion 345B is connected to the inner end edge first portion 345A and is located at the end portion near the inner end edge 346. The inner end edge second portion 345B is located inside the inner end edge first portion 345A in the second direction y. In the illustrated example, the inner end edge second portion 345B has an inner end edge straight line portion 345c and an inner end edge connecting portion 345d. The inner end edge straight line portion 345c extends linearly along the first direction x. The inner end edge connecting portion 345d is connected to both the inner end edge first portion 345A and the inner end edge straight line portion 345c. Therefore, with respect to the inner end edge 325 of the first annular portion 310 and the inner end edge 345 of the second annular portion 330, a distance (third distance D3) between the inner end edge 325 and the inner end edge 345 in the second direction y is set to be larger at the end portion near the inner end edge 346 than the center of the first direction x. The third distance D3 is not particularly limited. In the present embodiment, for example, the third distance D3 at the center of the first direction x (a distance between the inner end edge 325 and the inner end edge first portion 345A in the second direction y) is about 20 µm to 30 µm, and the third distance D3 at the end portion near the inner end edge 346 (a distance between the inner end edge 325 and the inner end edge straight line portion 345c in the second direction y) is about 30 µm to 50 µm.

The inner end edge 346 includes an inner end edge first portion 346A and an inner end edge second portion 346B. The inner end edge second portion 346B is connected to both the inner end edge first portion 346A and the inner end edge straight line portion 345c (the inner end edge second portion 345B) and is located at the end portion near the inner end edge 345. The inner end edge second portion 346B is located inside the inner end edge first portion 346A in the first direction x. In the shown example, the inner end edge second portion 346B has an inner end edge straight line portion 346c and an inner end edge connecting portion 346d. The inner end edge straight line portion 346c extends linearly along the second direction y. The inner end edge connecting portion 346d is connected to both the inner end edge first portion 346A and the inner end edge straight line portion 346c. Therefore, with respect to the inner end edge 326 of the first annular portion 310 and the inner end edge 346 of the second annular portion 330, a distance (fourth distance D4) between the inner end edge 326 and the inner end edge 346 in the first direction x is set to be larger at the end portion near the inner end edge 345 than the center of the second direction y. The fourth distance D4 is not particularly limited. In the present embodiment, for example, the fourth distance D4 at the center of the second direction y (a distance between the inner end edge 326 and the inner end edge first portion 346A in the first direction x) is about 20 µm to 30 µm, and the fourth distance D4 at the end portion near the inner end edge 345 (a distance between the inner end edge 326 and the inner end edge straight line portion 346c in the first direction x) is about 30 µm to 50 µm.

Further, the inner end edge second portion 346B is also connected to the inner end edge second portion 345B. As a result, the corner portion (the inner end edge second portion 345B and the inner end edge second portion 346B) of the inner end edge 345 and the inner end edge 346 has a shape that protrudes inward in both the first direction x and the second direction y. The corner portion (the inner end edge second portion 345B and the inner end edge second portion 346B) of the inner end edge 345 and the inner end edge 346 shown in FIG. 18 protrudes inward from the corner portion (the inner end edge overhanging portion 345E and the inner end edge overhanging portion 346E) of the inner end edge 345 and the inner end edge 346 shown in FIG. 10.

Figure 19:
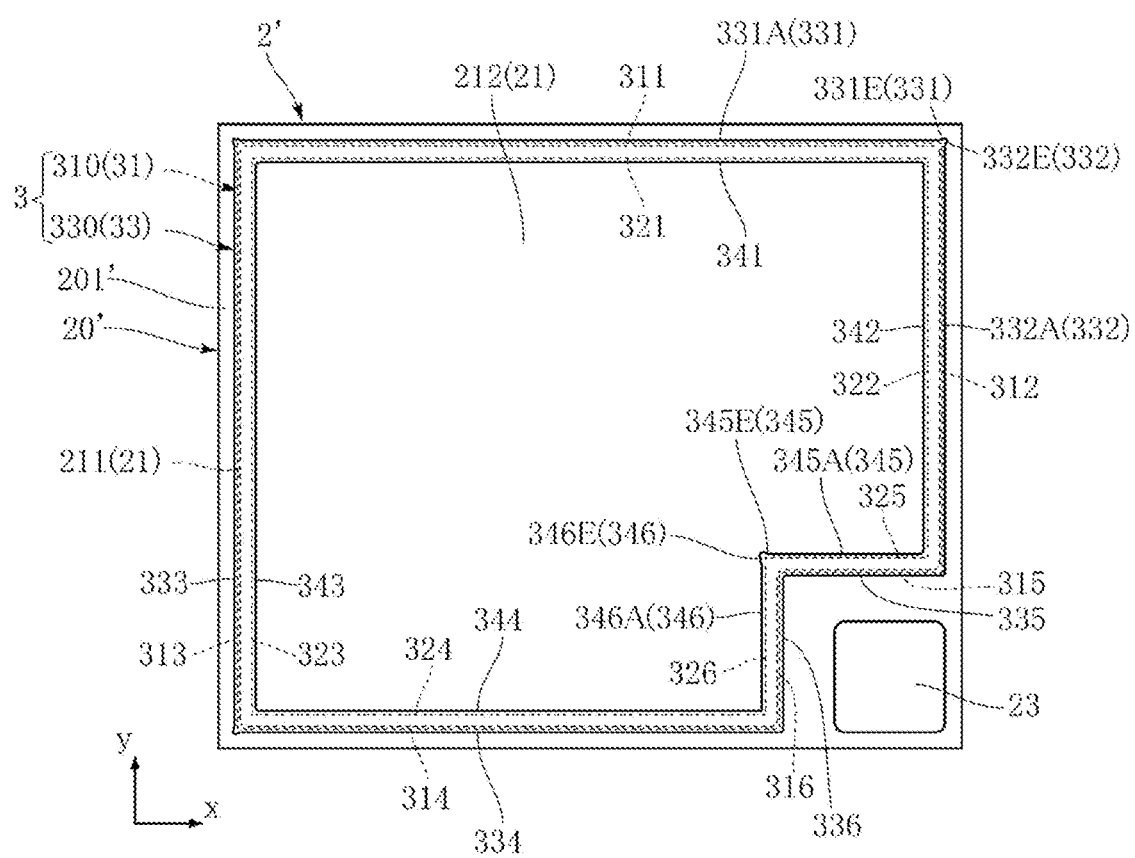
FIG. 19 is a plan view showing a step following FIG. 15.

FIG. 19 shows the second annular portion 330 after being heat-treated. Here, the second annular portion 330 (the second insulating layer 33) made of a polyimide resin is formed. The heat-treated second annular portion 330 shrinks as compared with the non-heat-treated second annular portion 330 shown in FIG. 15. The shrinkage of the resin material portion is remarkable at the corner portion of the outer end edge 331 and the outer end edge 332, the corner portion of the inner end edge 345 and the inner end edge 346, and the like. As shown in FIG. 19, the outer end edge overhanging portion 331E and the outer end edge overhanging portion 332E are formed at the corner portion of the outer end edge 331 and the outer end edge 332, and the inner end edge overhanging portion 345E and the inner end edge overhanging portion 346E are formed at the corner portion of the inner end edge 345 and the inner end edge 346. In this way, the insulator 3 including the first insulating layer 31 and the second insulating layer 33 is formed.

Figure 20:
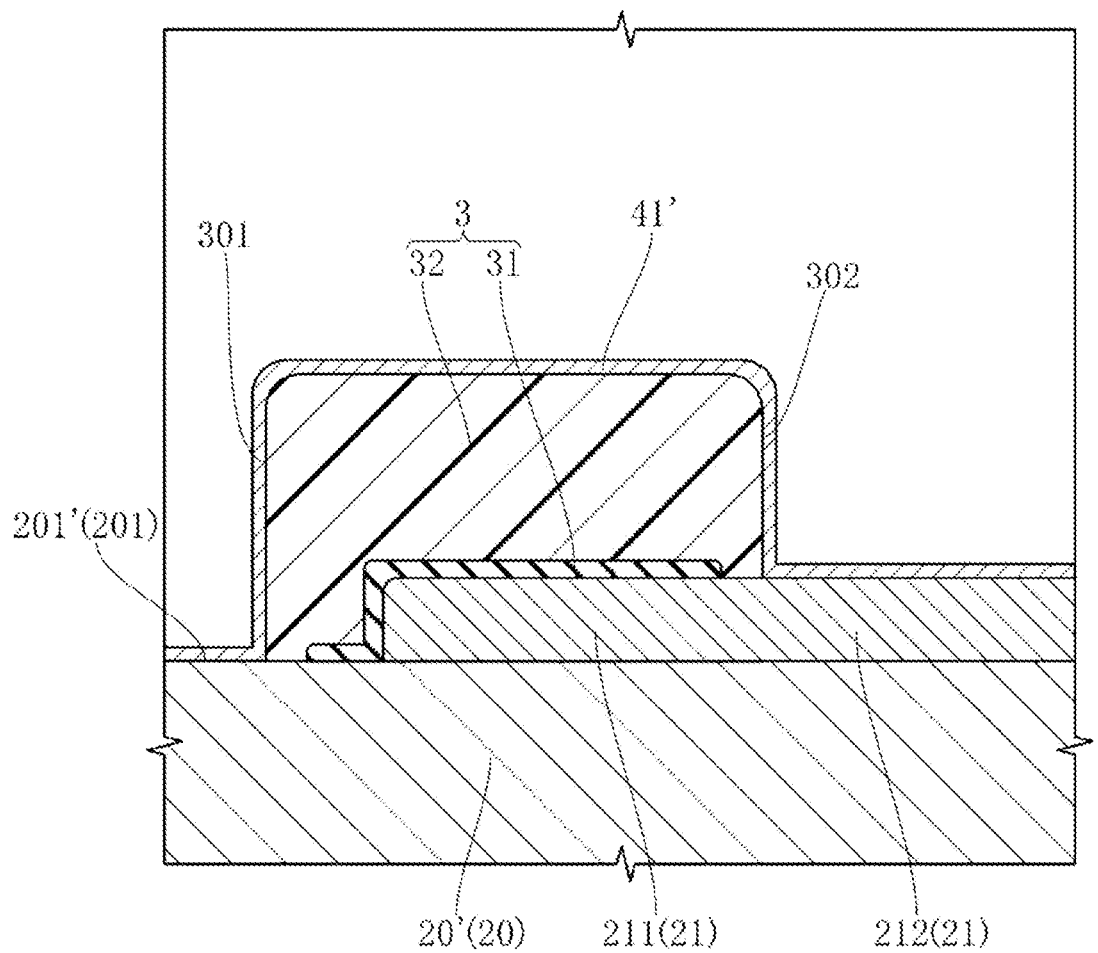
FIG. 20 is a partially enlarged cross-sectional view showing a step after FIG. 19.

Next, as shown in FIG. 20, a first metal layer material 41' is formed. The first metal layer material 41' is formed on at least the insulator 3 and the first electrode 21. The first metal layer material 41' is a metal layer formed by a thin film forming technique such as sputtering. The first metal layer material 41' is, for example, a Ti layer.

Figure 21:
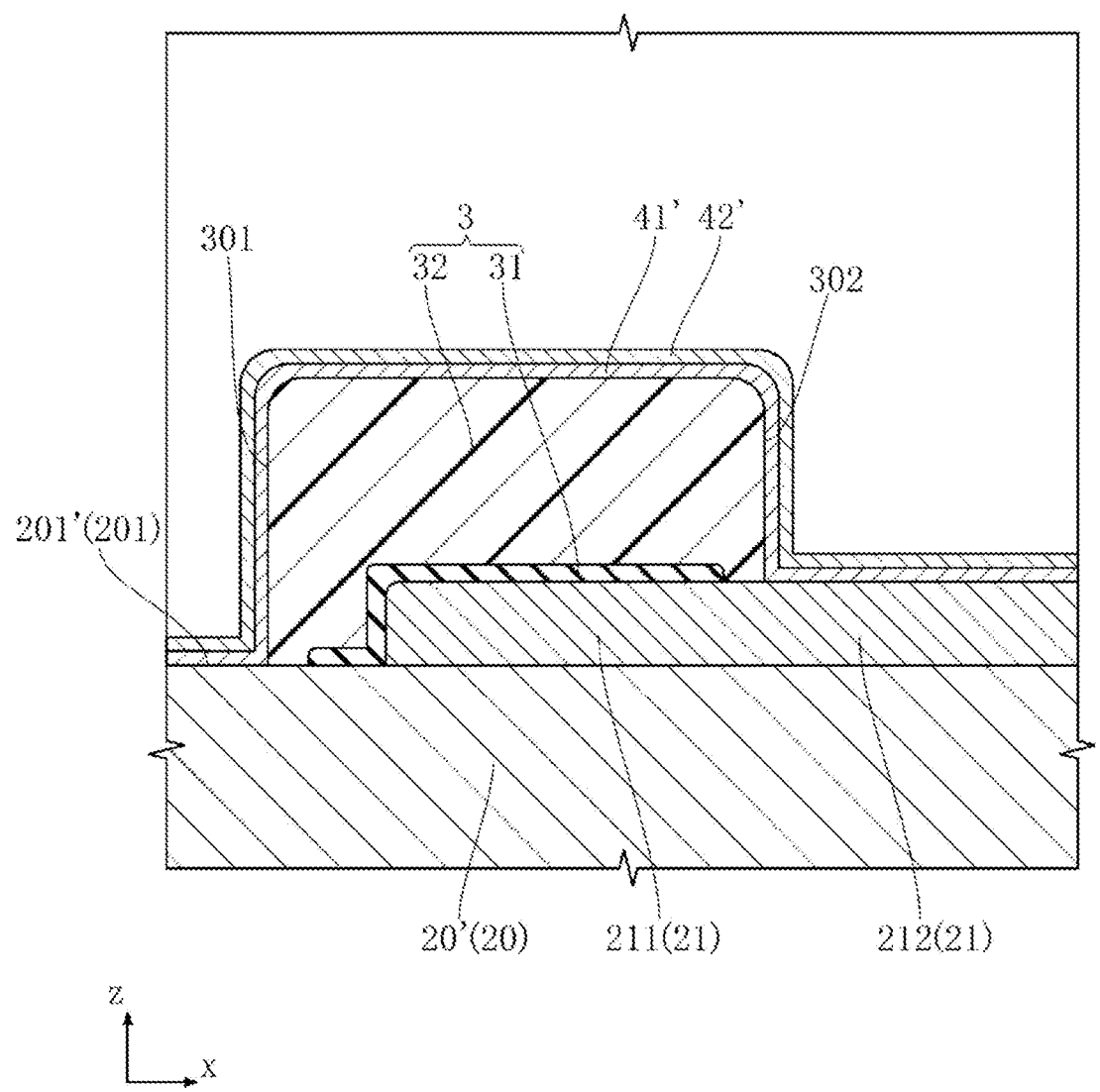
FIG. 21 is a partially enlarged cross-sectional view showing a step following FIG. 20.

Next, as shown in FIG. 21, a second metal layer material 42' is formed. The second metal layer material 42' is formed on the first metal layer material 41'. The second metal layer material 42' is a metal layer formed by a thin film forming technique such as sputtering. The second metal layer material 42' is formed of a metal material different from the first metal layer material 41', and is, for example, a Ni layer.

Figure 22:
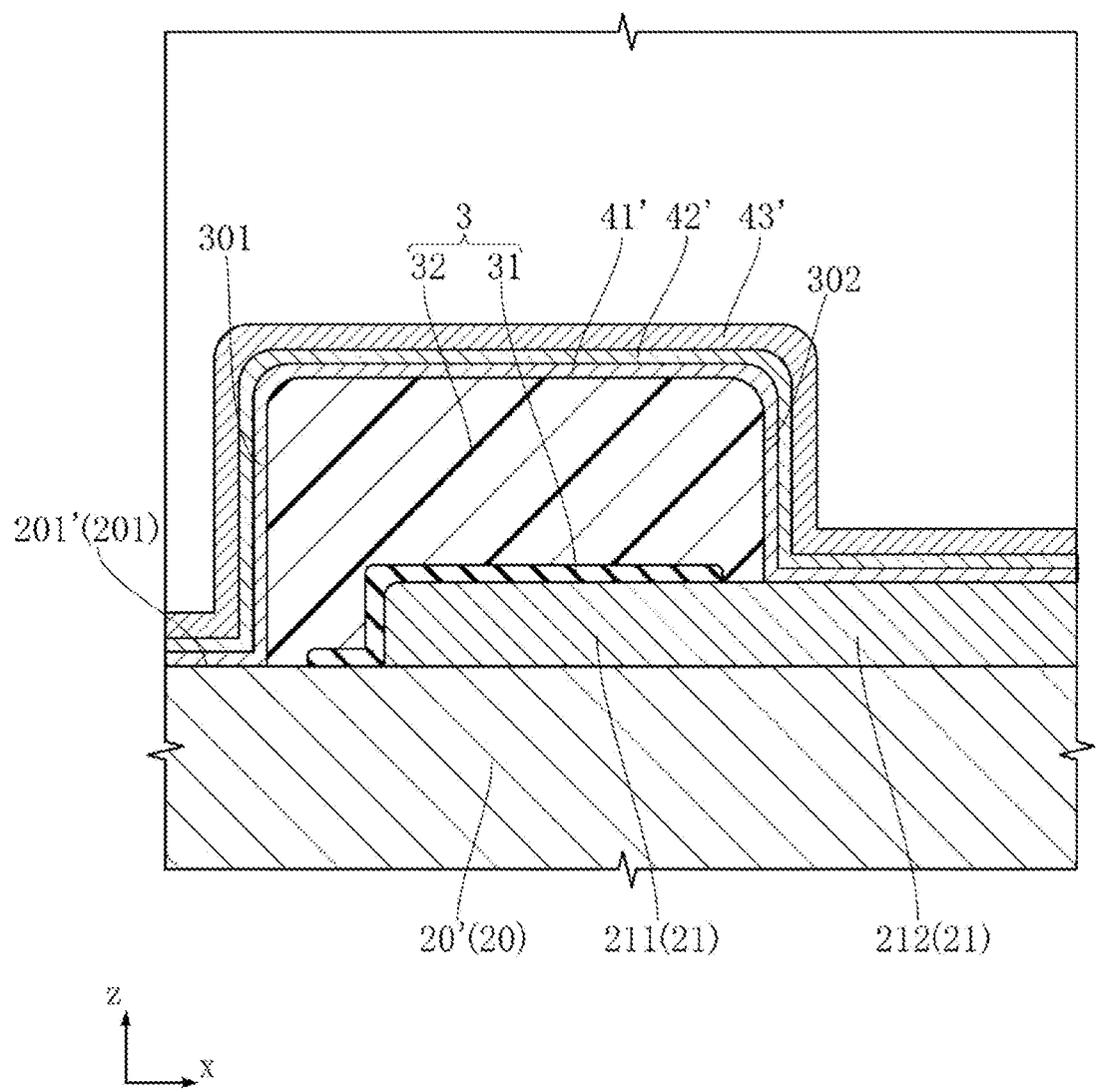
FIG. 22 is a partially enlarged cross-sectional view showing a step following FIG. 21.

Next, as shown in FIG. 22, a third metal layer material 43' is formed. The third metal layer material 43' is formed on the second metal layer material 42'. The third metal layer material 43' is a metal layer formed by a thin film forming technique such as sputtering. The third metal layer material 43' is formed of a metal material different from any of the first metal layer material 41' and the second metal layer material 42', and is, for example, an Ag layer.

Figure 23:
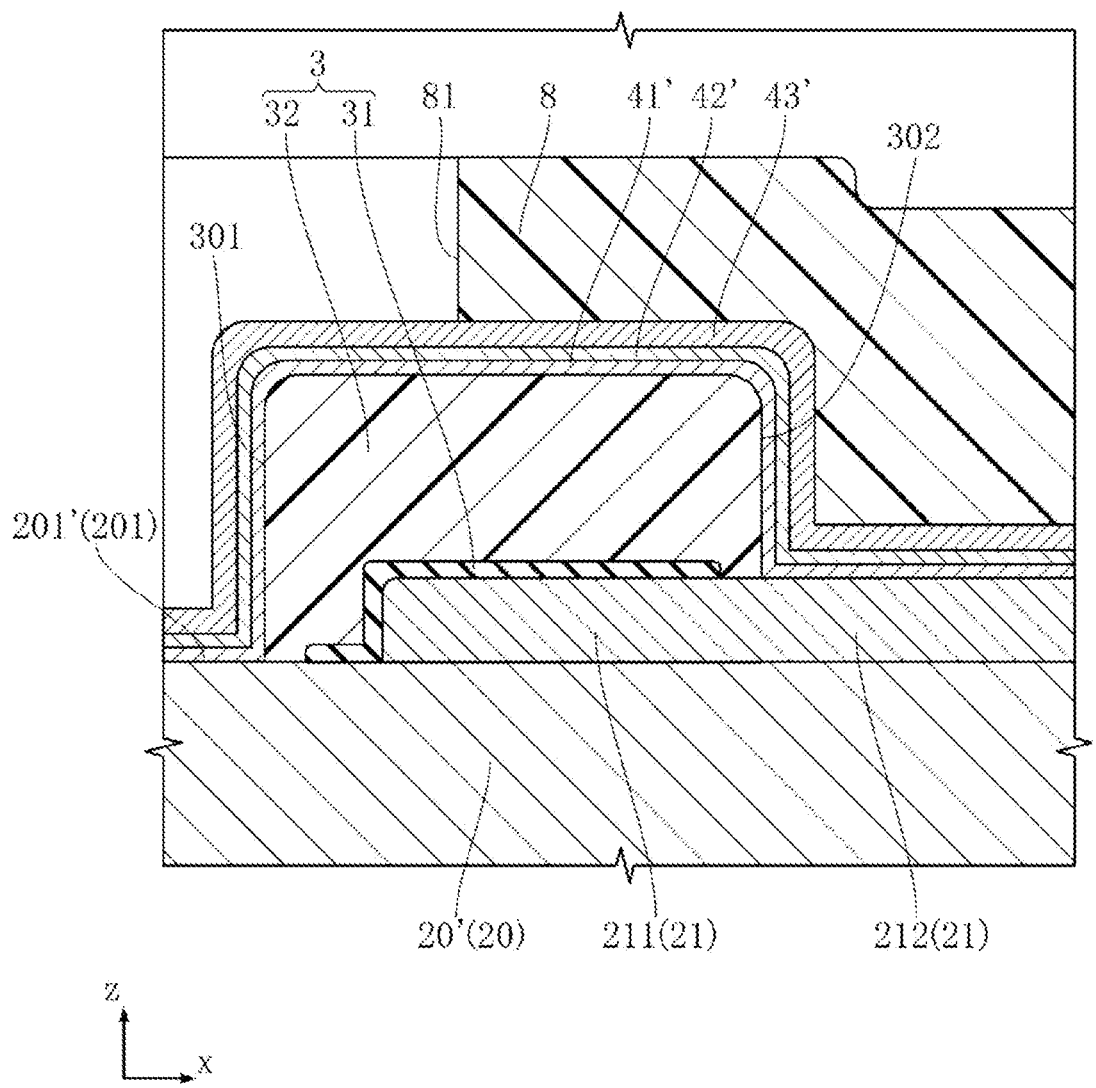
FIG. 23 is a partially enlarged cross-sectional view showing a step following FIG. 22.

Next, as shown in FIG. 23, a resist 8 is formed. The resist 8 can be formed, for example, by exposure/development by a photolithography technique. In the formation of the resist 8, a photosensitive material is coated on the third metal layer material 43', and is subjected to an exposing/developing process of a predetermined pattern. As a result, the resist 8 having an opening 81 is formed. The opening 81 overlaps with a portion of the insulator 3 (a portion on the outer end edge 301 side) when viewed in the thickness direction z. Here, since the thickness of the second insulating layer 33 is relatively large, the thickness of the resist 8 formed over the first electrode pad 212 and the second insulating layer 33 is increased so that a large step does not occur in the resist 8. Further, in order to appropriately form the opening 81 in the resist 8 having a large thickness, it is preferable that the amount of exposure to the photosensitive material is twice or more the usual amount and the development of the photosensitive material is performed a plurality of times.

Figure 24:
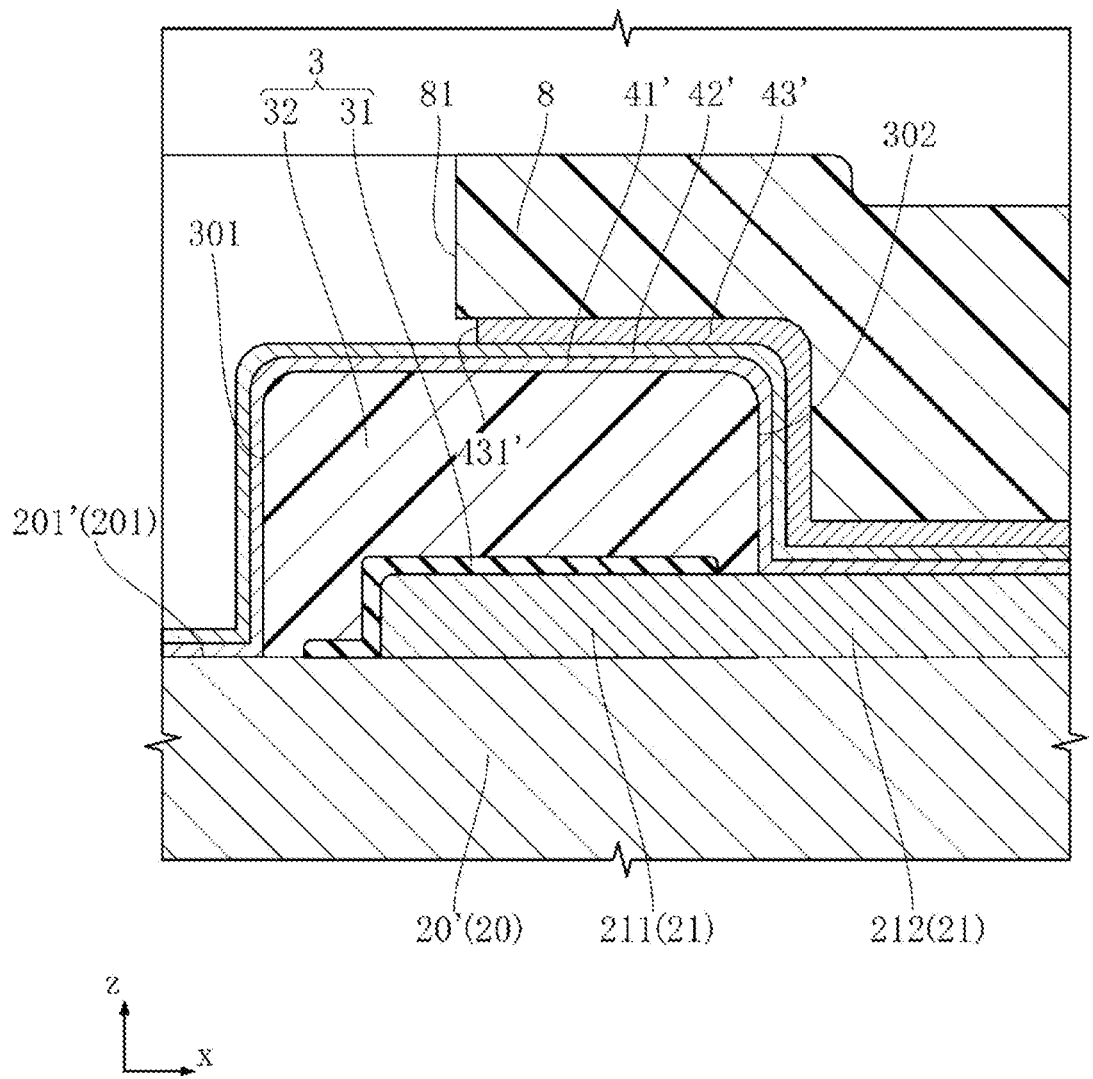
FIG. 24 is a partially enlarged cross-sectional view showing a step following FIG. 23.

Next, as shown in FIG. 24, a portion of the third metal layer material 43' is removed. Specifically, wet etching is performed on the third metal layer material 43' using the resist 8 as a mask (first etching step). The wet etching process of the third metal layer material 43' is performed using a chemical solution that dissolves the third metal layer material 43'. As a result, as shown in FIG. 24, in the third metal layer material 43', a part exposed from the resist 8 and a portion of a part covered with the resist 8 are removed to form an end edge 431'.

Figure 25:
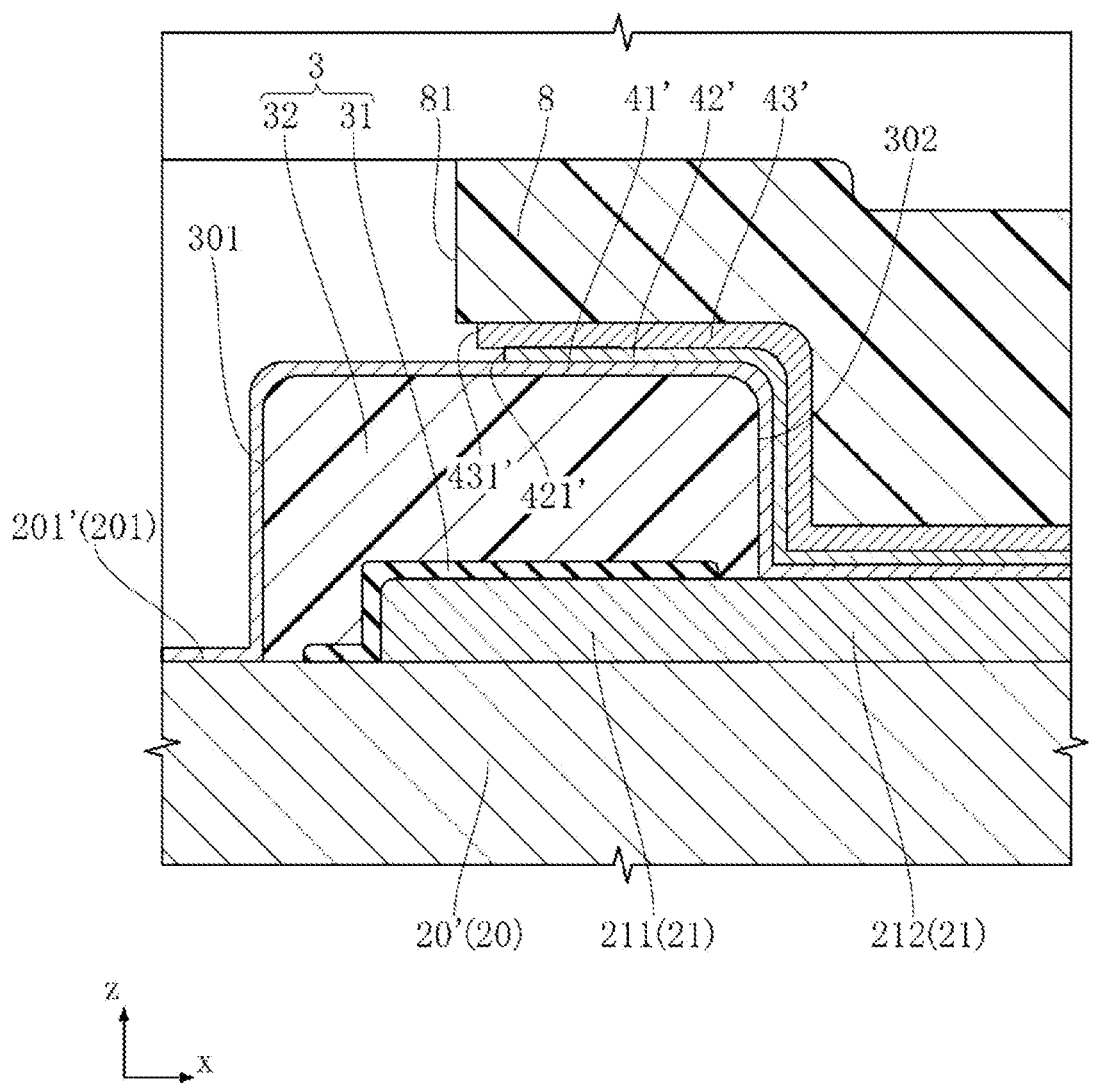
FIG. 25 is a partially enlarged cross-sectional view showing a step following FIG. 24.

Next, as shown in FIG. 25, a portion of the second metal layer material 42' is removed. Specifically, wet etching is performed on the second metal layer material 42' using the resist 8 as a mask (second etching step). The wet etching process of the second metal layer material 42' is performed using a chemical solution that dissolves the second metal layer material 42'. As a result, as shown in FIG. 25, in the second metal layer material 42', a part exposed from the third metal layer material 43' and a portion of a part covered with the third metal layer material 43' are removed to form an end edge 421'.

Figure 26:
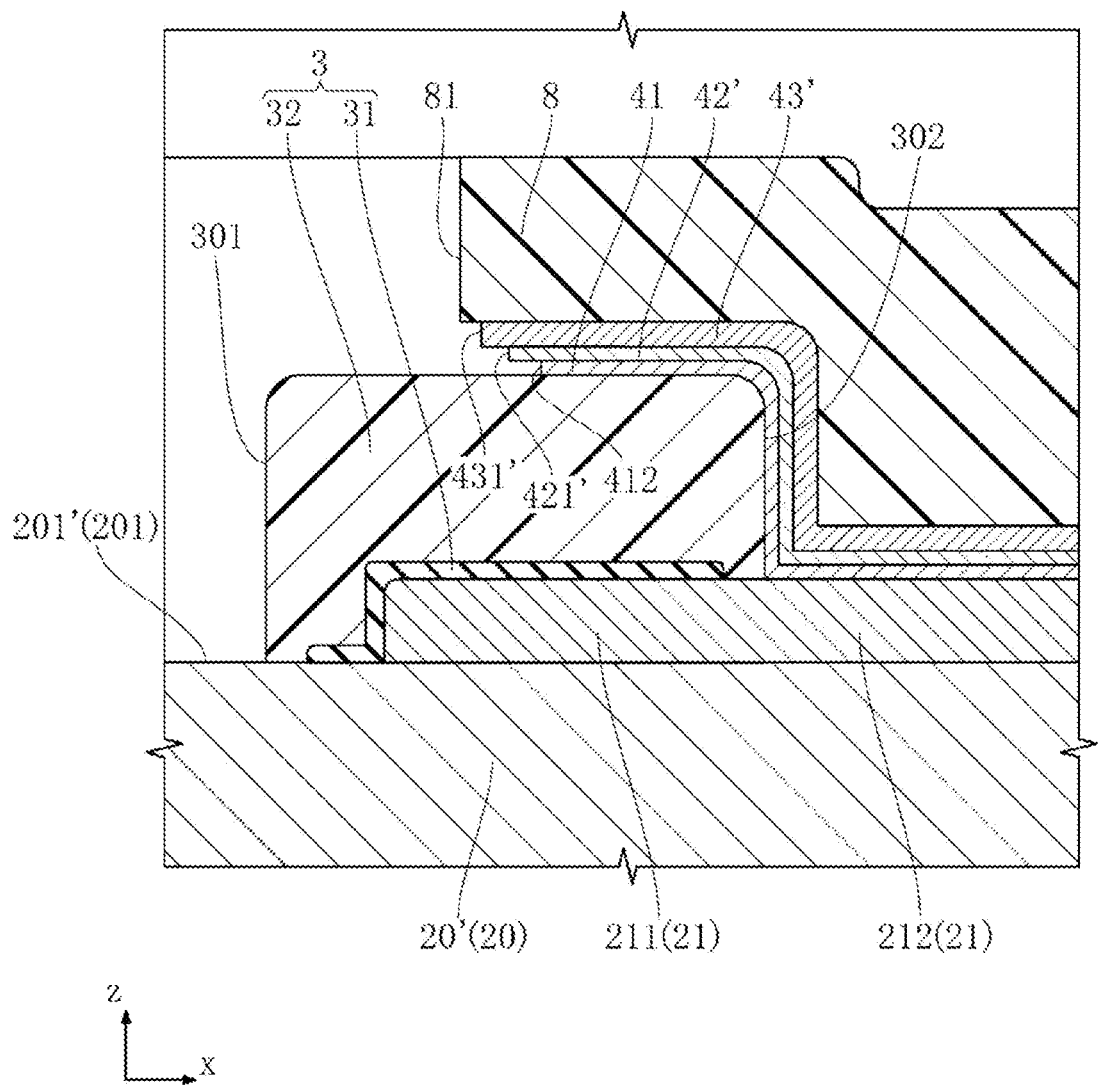
FIG. 26 is a partially enlarged cross-sectional view showing a step following FIG. 25.

Next, as shown in FIG. 26, a portion of the first metal layer material 41' is removed. Specifically, wet etching is performed on the first metal layer material 41' using the resist 8 as a mask (third etching step). The wet etching process of the first metal layer material 41' is performed using a chemical solution that dissolves the first metal layer material 41'. As a result, as shown in FIG. 26, in the first metal layer material 41', a part exposed from the second metal layer material 42' and a portion of a part covered with the second metal layer material 42' are removed to form the first metal layer 41 having the first end edge 412.

Figure 27:
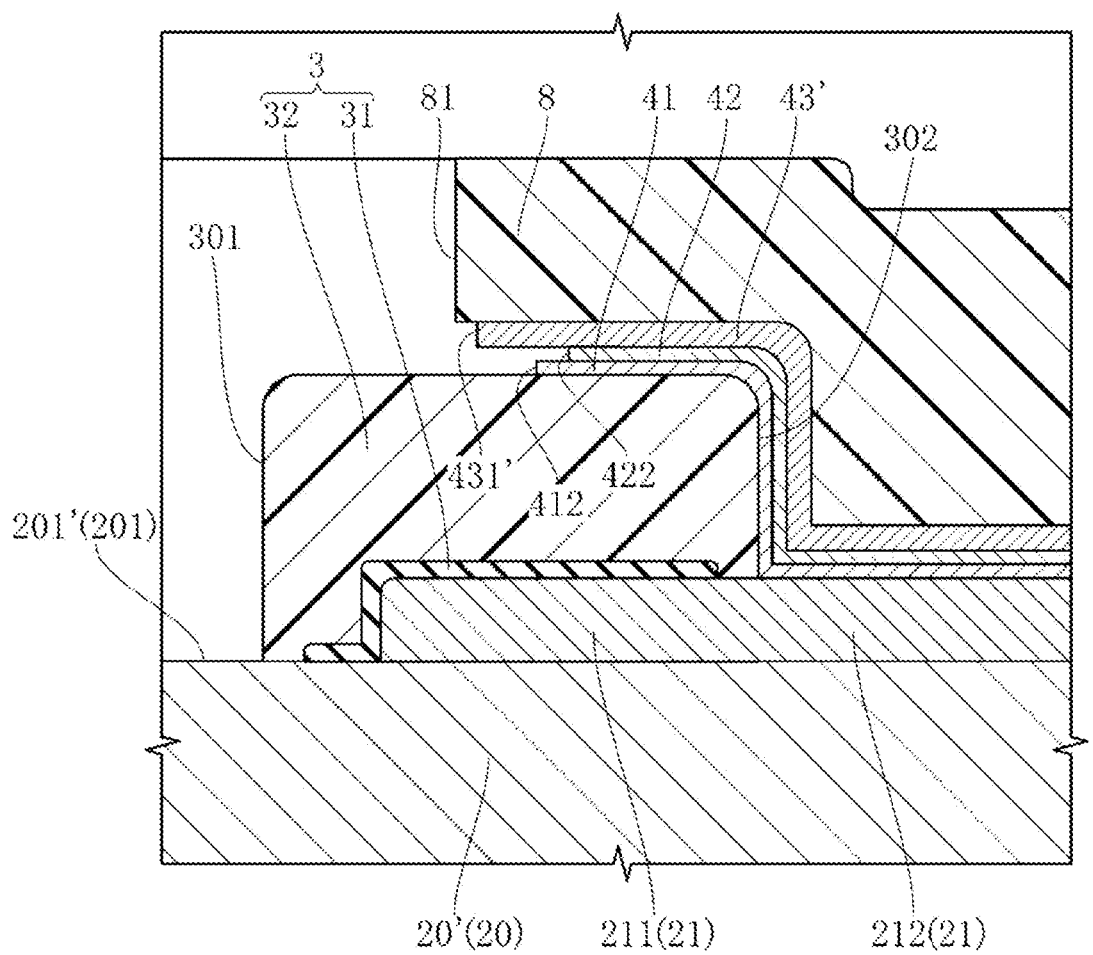
FIG. 27 is a partially enlarged cross-sectional view showing a step following FIG. 26.

Next, as shown in FIG. 27, a portion of the second metal layer material 42' is removed. Specifically, wet etching is performed on the second metal layer material 42' using the resist 8 as a mask (fourth etching step). The wet etching process of the second metal layer material 42' is performed using a chemical solution that dissolves the second metal layer material 42'. As a result, as shown in FIG. 27, in the second metal layer material 42', a part exposed from the first metal layer 41 and a portion of a part covered with the first metal layer 41 are removed to form the second metal layer 42 having the second end edge 422.

Figure 28:
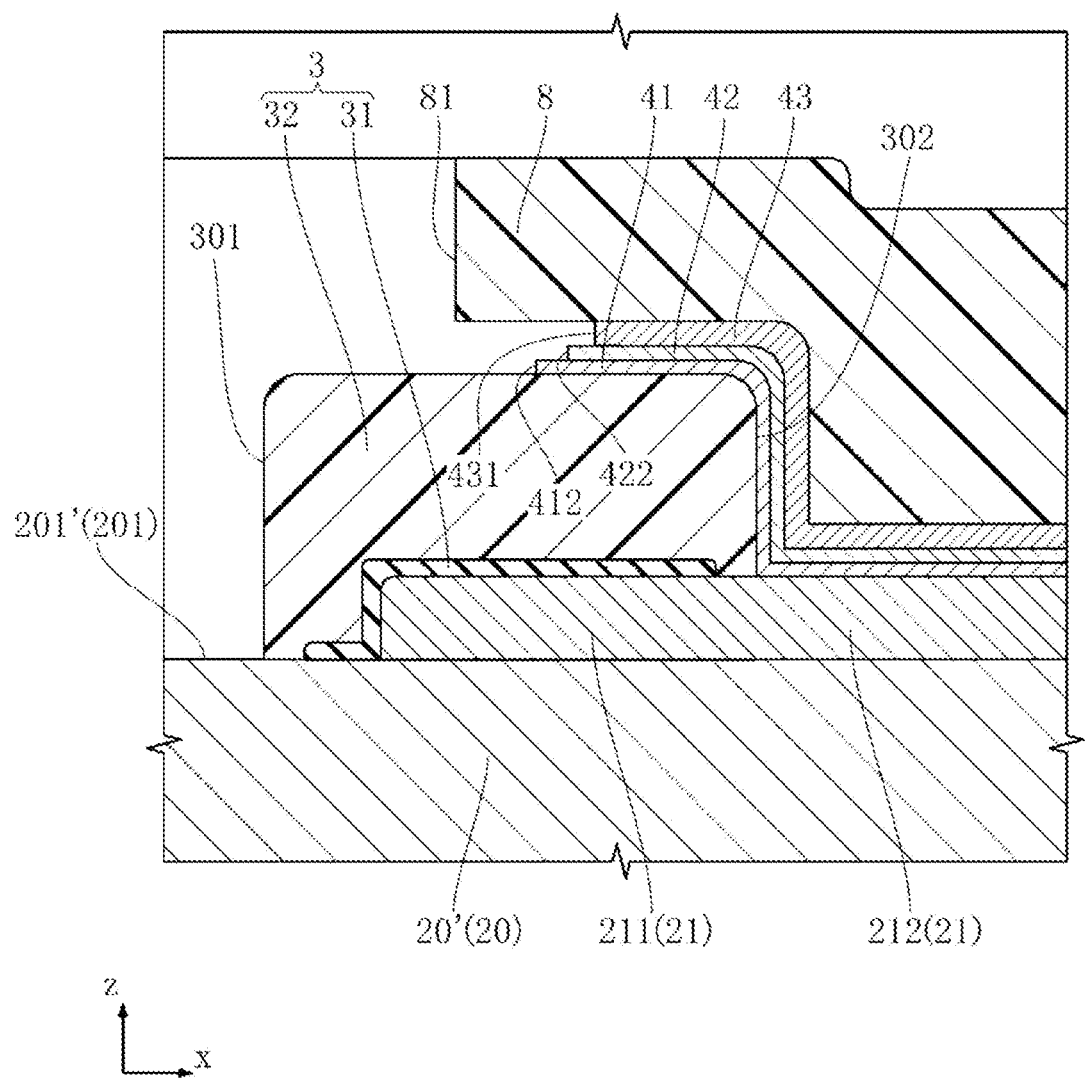
FIG. 28 is a partially enlarged cross-sectional view showing a step following FIG. 27.
Figure 29:
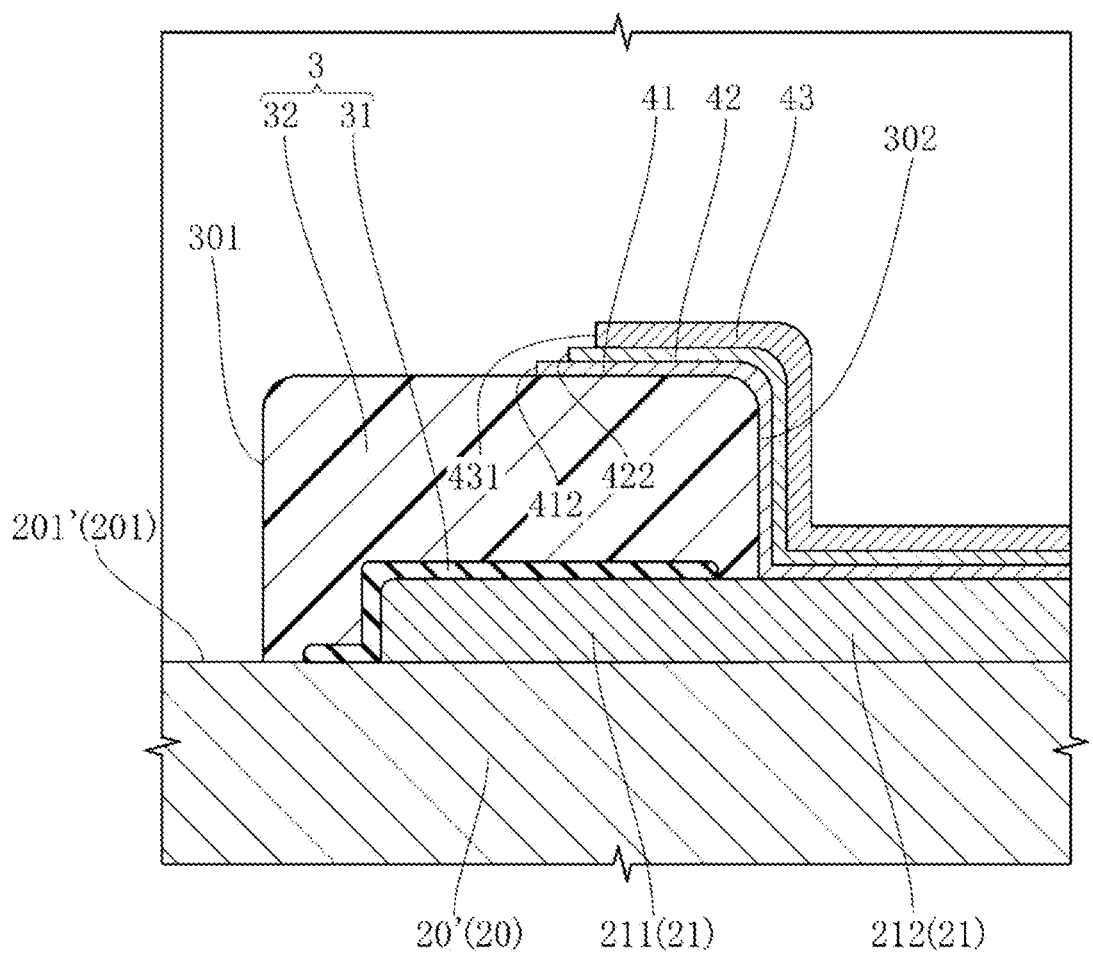
FIG. 29 is a partially enlarged cross-sectional view showing a step following FIG. 28.

Next, as shown in FIG. 28, a portion of the third metal layer material 43' is removed. Specifically, wet etching is performed on the third metal layer material 43' using the resist 8 as a mask (fifth etching step). The wet etching process of the third metal layer material 43' is performed using a chemical solution that dissolves the third metal layer material 43'. As a result, as shown in FIG. 28, in the third metal layer material 43', a part exposed from the second metal layer 42 and a portion of a part covered with the second metal layer 42 are removed to form the third metal layer 43 having the third end edge 431. In this way, the first metal layer 41, the second metal layer 42, and the third metal layer 43, which are laminated in a stepped manner, are formed. The positions of the first end edge 412, the second end edge 422, and the third end edge 431 (in FIG. 28, the position of each of the first edge 412, the second edge 422, and the third edge 431 in the first direction x) can be adjusted by changing the etching conditions in each etching process. Next, as shown in FIG. 29, the resist 8 is removed.

After that, the base material 20' (the substrate board 2') is cut along a plane perpendicular to the first direction x and a plane perpendicular to the second direction y to be divided into a plurality of semiconductor elements 2. Next, a lead frame having a shape including the first lead 1A, the second lead 1B, and the third lead 1C is prepared, and bonding of the semiconductor element 2, boding of the conductive member 5, and wire bonding of the wire 65 to the lead frame are performed. Next, the sealing resin 7 is formed by molding. Next, the lead frame is appropriately cut to separate the first lead 1A, the second lead 1B, and the third lead 1C from one another. Through the above steps, the semiconductor device A10 shown in FIGS. 1 to 10 is manufactured.

Next, the operation and effects of the present embodiment will be described.

The semiconductor device A10 includes the semiconductor element 2, the insulator 3, the first metal layer 41, and the second metal layer 42. The insulator 3 is arranged over the first electrode 21 and the element main surface 201 of the semiconductor element 2. The first metal layer 41 is arranged on the first electrode 21 (the first electrode pad 212) and the insulator 3, and the second metal layer 42 is laminated on the first metal layer 41. The outer peripheral edge (the first end edge 412) of the first metal layer 41 is located between the outer end edge 301 and the inner end edge 302 of the insulator 3 when viewed in the thickness direction z, and the outer peripheral edge (the second end edge 422) of the second metal layer 42 is located between the first end edge 412 and the inner end edge 302 when viewed in the thickness direction z. With such a configuration, since the first metal layer 41 and the second metal layer 42 are laminated in a stepped manner on the first electrode pad 212 and the insulator 3, it is possible to suppress peeling of the first metal layer 41 and the second metal layer 42.

The semiconductor device A10 includes the third metal layer 43. The third metal layer 43 is laminated on the second metal layer 42. The outer peripheral edge (the third end edge 431) of the third metal layer 43 is located between the second end edge 422 and the inner end edge 302 when viewed in the thickness direction z. With such a configuration, since the first metal layer 41, the second metal layer 42, and the third metal layer 43 are laminated in a stepped manner on the first electrode pad 212 and the insulator 3, it is possible to suppress peeling of the first metal layer 41, the second metal layer 42, and the third metal layer 43.

The insulator 3 includes the first insulating layer 31 and the second insulating layer 33. The first insulating layer 31 is arranged over the first electrode 21 and the element main surface 201. The second insulating layer 33 is laminated on the first insulating layer 31. With such a configuration, the insulator 3 (the first insulating layer 31 and the second insulating layer 33) can have different characteristics according to the properties of each insulating layer.

The thickness of the second insulating layer 33 is larger than the thickness of the first insulating layer 31. With such a configuration, the mechanical properties of the insulator 3 including the second insulating layer 33 are enhanced. As a preferred example, the thickness of the second insulating layer 33 is 5 to 50 times the thickness of the first insulating layer 31. The second insulating layer 33 is made of a polyimide resin. With such a configuration, the mechanical properties of the insulator 3 are further enhanced. As a result, the semiconductor device A10 is suitable for being mounted on, for example, a device in which relatively large vibration can occur (for example, a device for automobile).

The second insulating layer 33 covers the entire first insulating layer 31 and a portion of each of the first electrode 21 and the element main surface 201. With such a configuration, the mechanical properties of the insulator 3 can be enhanced, and the first insulating layer 31 can be appropriately protected by the second insulating layer 33.

The thickness of the third metal layer 43 is larger than either the thickness of the first metal layer 41 or the thickness of the second metal layer 42. With such a configuration, the mechanical properties of the third metal layer 43 can be enhanced. Further, when the conductive member 5 is bonded onto the first electrode pad 212, an impact at the time of bonding can be alleviated. The constituent material of the third metal layer 43 includes silver. With such a configuration, the third metal layer 43 is excellent in thermal conductivity. As a result, heat generated by the semiconductor element 2 can be efficiently released to the conductive member 5 side via the third metal layer 43.

<First Modification of the First Embodiment>

Figure 30:
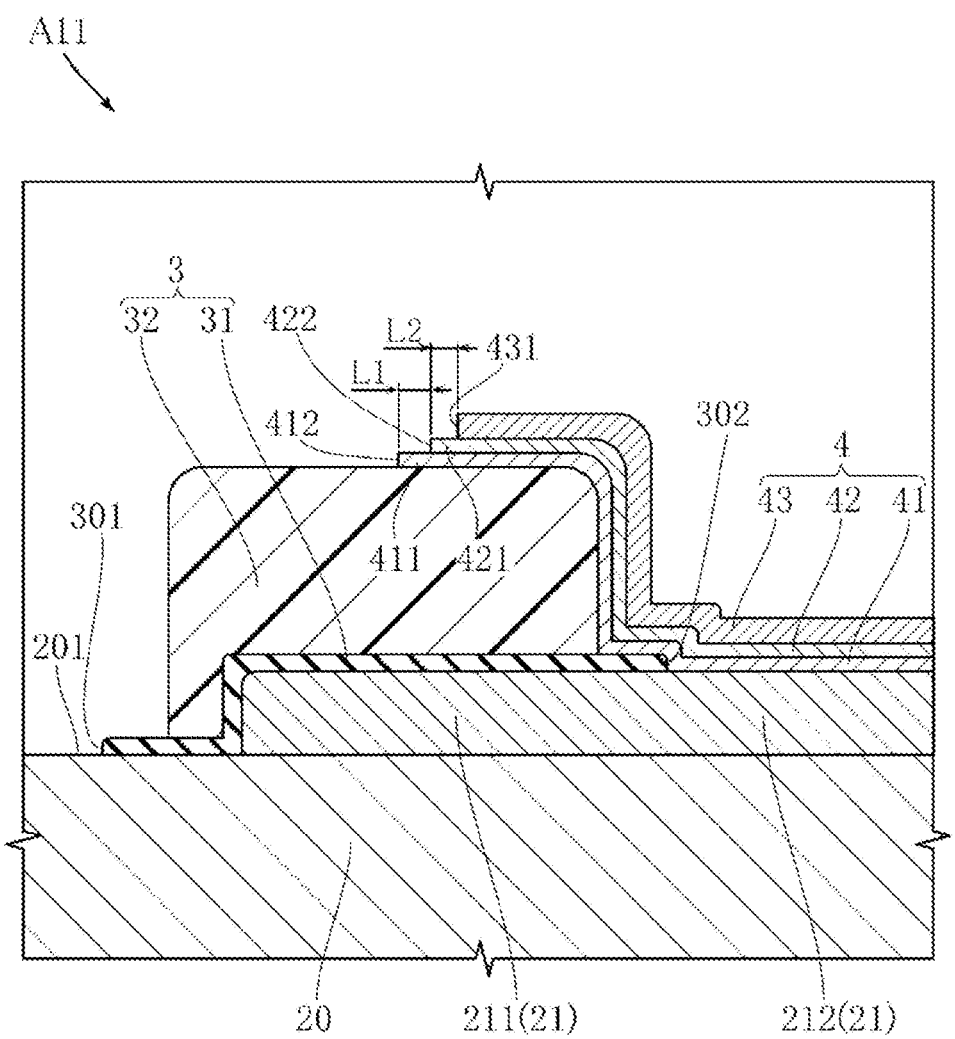
FIG. 30 is a cross-sectional view similar to FIG. 8, showing a semiconductor device according to a first modification of the first embodiment.

FIG. 30 shows a semiconductor device according to a first modification of the first embodiment. FIG. 30 is a cross-sectional view similar to FIG. 8 shown in the above embodiment. Throughout the drawings after FIG. 30, the same or similar elements as those in the semiconductor device A10 of the above embodiment are denoted by the same reference numerals as those of the above embodiment, and explanation thereof will be omitted as appropriate.

A semiconductor device A11 of this modification is different from the semiconductor device A10 of the above embodiment in the configuration of the insulator 3. In this modification, the second insulating layer 33 does not cover all of the first insulating layer 31. Both ends of the strip-shaped portion constituting the first insulating layer 31 in the width direction (the left-right direction in FIG. 30) are exposed from the second insulating layer 33. Also in the semiconductor device A11 of this modification, since the first metal layer 41, the second metal layer 42, and the third metal layer 43 are laminated in a stepped manner on the first electrode pad 212 and the insulator 3, it is possible to suppress peeling of the first metal layer 41, the second metal layer 42, and the third metal layer 43. In addition, the same operation and effects as those of the above embodiment are obtained within the range of the same configuration as the semiconductor device A10 of the above embodiment.

<Second Modification of the First Embodiment>

Figure 31:
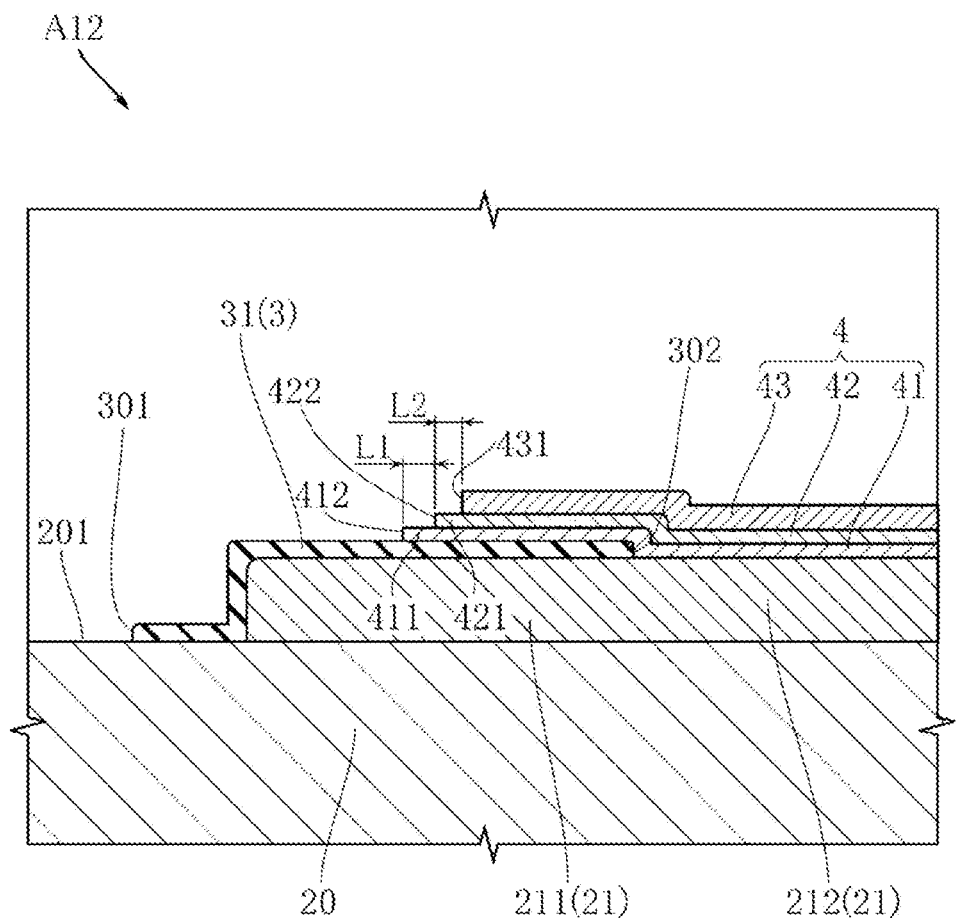
FIG. 31 is a cross-sectional view similar to FIG. 8, showing a semiconductor device according to a second modification of the first embodiment.

FIG. 31 shows a semiconductor device according to a second modification of the first embodiment. FIG. 31 is a cross-sectional view similar to FIG. 8 shown in the above embodiment. A semiconductor device A12 of this modification is different from the semiconductor device A10 of the above embodiment in the configuration of the insulator 3. In this modification, the insulator 3 does not include the second insulating layer 33, but includes the first insulating layer 31. Also in the semiconductor device A12 of this modification, since the first metal layer 41, the second metal layer 42, and the third metal layer 43 are laminated in a stepped manner on the first electrode pad 212 and the insulator 3, it is possible to suppress peeling of the first metal layer 41, the second metal layer 42, and the third metal layer 43. In addition, the same operation and effects as those of the above embodiment are obtained within the range of the same configuration as the semiconductor device A10 of the above embodiment.

The semiconductor device according to the present disclosure is not limited to the above-described embodiment. The specific configurations of various parts of the semiconductor device according to the present disclosure can be freely changed in design.

The present disclosure includes the configurations related to the following Supplementary Notes.

[Supplementary Note 1]

A semiconductor device including:
  a semiconductor element that includes an element main body having an element main surface and an element back surface facing opposite sides to each other in a thickness direction, and a first electrode arranged on the element main surface;
  an insulator that has an annular shape overlapping an outer peripheral edge of the first electrode when viewed in the thickness direction and is arranged over the first electrode and the element main surface;
  a first metal layer arranged over the first electrode and the insulator; and
  a second metal layer laminated on the first metal layer and overlapping both the first electrode and the insulator when viewed in the thickness direction,
  wherein the first electrode includes a first electrode pad located inside an inner end edge of the insulator when viewed in the thickness direction,
  wherein a first end edge, which is an outer peripheral edge of the first metal layer, is located between an outer end edge and the inner end edge of the insulator when viewed in the thickness direction, and
  wherein a second end edge, which is an outer peripheral edge of the second metal layer, is located between the first end edge and the inner end edge when viewed in the thickness direction.

[Supplementary Note 2]

The semiconductor device of Supplementary Note 1, further including: a third metal layer laminated on the second metal layer and overlapping both the first electrode and the insulator when viewed in the thickness direction,
  wherein a third end edge, which is an outer peripheral edge of the third metal layer, is located between the second end edge and the inner end edge when viewed in the thickness direction.

[Supplementary Note 3]

The semiconductor device of Supplementary Note 2, wherein the insulator includes a first insulating layer arranged over the first electrode and the element main surface, and a second insulating layer laminated on the first insulating layer.

[Supplementary Note 4]

The semiconductor device of Supplementary Note 3, wherein a thickness of the second insulating layer is larger than a thickness of the first insulating layer.

[Supplementary Note 5]

The semiconductor device of Supplementary Note 4, wherein the thickness of the second insulating layer is 5 to 50 times the thickness of the first insulating layer.

[Supplementary Note 6]

The semiconductor device of any one of Supplementary Notes 3 to 5, wherein the second insulating layer is made of a polyimide resin.

[Supplementary Note 7]

The semiconductor device of any one of Supplementary Notes 3 to 6, wherein the second insulating layer covers the entire first insulating layer and a portion of each of the first electrode and the element main surface.

[Supplementary Note 8]

The semiconductor device of any one of Supplementary Notes 2 to 7, wherein a thickness of the third metal layer is larger than either a thickness of the first metal layer or the thickness of the second metal layer.

[Supplementary Note 9]

The semiconductor device of any one of Supplementary Notes 2 to 8, wherein a constituent material of the third metal layer includes silver.

[Supplementary Note 10]

The semiconductor device of any one of Supplementary Notes 2 to 9, wherein a first dimension, which is a distance between the first end edge and the second end edge when viewed in the thickness direction, is 10 to 50 times a thickness of the first metal layer.

[Supplementary Note 11]

The semiconductor device of any one of Supplementary Notes 2 to 10, wherein a second dimension, which is a distance between the second end edge and the third end edge when viewed in the thickness direction, is 10 to 50 times a thickness of the second metal layer.

[Supplementary Note 12]

The semiconductor device of Supplementary Note 7, wherein a third dimension, which is a distance between the third end edge and the inner end edge when viewed in the thickness direction, is 1 to 5 times a thickness of the third metal layer.

[Supplementary Note 13]

The semiconductor device of any one of Supplementary Notes 1 to 12, further including:
 a conductive member made of a metal plate; and
 a first conductive bonding material that conductively bonds the first electrode pad and the conductive member.

[Supplementary Note 14]

The semiconductor device of Supplementary Note 13, wherein the semiconductor element includes a second electrode arranged on the element back surface, and
 wherein the semiconductor device further includes:
  a first lead formed of a metal plate and including an element bonding portion on which the semiconductor element is mounted; and
  a second conductive bonding material that conductively bonds the element bonding portion and the second electrode.

[Supplementary Note 15]

The semiconductor device of Supplementary Note 14, further including:
 a second lead arranged apart from the first lead when viewed in the thickness direction and formed of a metal plate; and
 a third conductive bonding material that conductively bonds the second lead and the conductive member.

[Supplementary Note 16]

The semiconductor device of Supplementary Note 15, wherein the semiconductor element includes a third electrode arranged on the element main surface, and
 wherein the semiconductor device further includes:
  a third lead arranged apart from the first lead and the second lead when viewed in the thickness direction and formed of a metal plate; and
  a wire that conductively bonds the third electrode and the third lead.

[Supplementary Note 17]

The semiconductor device of Supplementary Note 16, wherein the first electrode is a source electrode, the second electrode is a drain electrode, and the third electrode is a gate electrode.

[Supplementary Note 18]

A method of manufacturing a semiconductor device, including:
 a step of arranging an insulator over a first electrode and an element main surface on a semiconductor element that includes an element main body having an element main surface facing one side of a thickness direction, and the first electrode arranged on the element main surface;
 a step of forming a first metal layer material on the first electrode and the insulator;
 a step of forming a second metal layer material on the first metal layer material;
 a step of forming a third metal layer material on the second metal layer material;
 a step of forming, on the third metal layer material, a resist having an opening that overlaps a portion of the insulator when viewed in the thickness direction;
 a first etching step of performing wet etching on the third metal layer material using the resist as a mask;
 a second etching step of performing wet etching on the second metal layer material using the resist as a mask;
 a third etching step of performing wet etching on the first metal layer material using the resist as a mask;
 a fourth etching step of performing wet etching on the second metal layer material using the resist as a mask;
 a fifth etching step of performing wet etching on the third metal layer material using the resist as a mask; and
 a step of removing the resist.

According to a semiconductor device of the present disclosure, it is possible to suppress peeling of a metal layer arranged over an electrode pad portion and an insulator.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
 a semiconductor element that includes an element main body having an element main surface and an element back surface facing opposite sides to each other in a thickness direction, and a first electrode arranged on the element main surface, an outer peripheral edge portion of the first electrode being in direct contact with the element main surface;
 an insulator that has an annular shape overlapping the outer peripheral edge portion of the first electrode when viewed in the thickness direction and is arranged over the first electrode and the element main surface;
 a first metal layer arranged over the first electrode and the insulator; and
 a second metal layer laminated on the first metal layer and overlapping both the first electrode and the insulator when viewed in the thickness direction, wherein the first electrode includes a first electrode pad located inside an inner end edge of the insulator when viewed in the thickness direction, wherein a first end edge, which is an outer peripheral edge of the first metal layer, is located between an outer end edge and the inner end edge of the insulator when viewed in the thickness direction, wherein a second end edge, which is an outer peripheral edge of the second metal layer, is located between the first end edge and the inner end edge when viewed in the thickness direction, and wherein the insulator overlaps the first electrode along the outer peripheral edge portion of the first electrode on a region where the outer peripheral edge portion of the first electrode is in direct contact with the element main surface.

2. The semiconductor device of claim 1, further comprising:
a third metal layer laminated on the second metal layer and overlapping both the first electrode and the insulator when viewed in the thickness direction,
wherein a third end edge, which is an outer peripheral edge of the third metal layer, is located between the second end edge and the inner end edge when viewed in the thickness direction.

3. The semiconductor device of claim 2, wherein the insulator includes:
a first insulating layer arranged over the first electrode and the element main surface; and
a second insulating layer laminated on the first insulating layer.

4. The semiconductor device of claim 3, wherein a thickness of the second insulating layer is larger than a thickness of the first insulating layer.

5. The semiconductor device of claim 4, wherein the thickness of the second insulating layer is 5 to 50 times the thickness of the first insulating layer.

6. The semiconductor device of claim 3, wherein the second insulating layer is made of a polyimide resin.

7. The semiconductor device of claim 3, wherein the second insulating layer covers the entire first insulating layer and a portion of each of the first electrode and the element main surface.

8. The semiconductor device of claim 2, wherein a thickness of the third metal layer is larger than either a thickness of the first metal layer or a thickness of the second metal layer.

9. The semiconductor device of claim 2, wherein a constituent material of the third metal layer includes silver.

10. The semiconductor device of claim 2, wherein a first dimension, which is a distance between the first end edge and the second end edge when viewed in the thickness direction, is 10 to 50 times a thickness of the first metal layer.

11. The semiconductor device of claim 2, wherein a second dimension, which is a distance between the second end edge and the third end edge when viewed in the thickness direction, is 10 to 50 times a thickness of the second metal layer.

12. The semiconductor device of claim 7, wherein a third dimension, which is a distance between the third end edge and the inner end edge when viewed in the thickness direction, is 1 to 5 times a thickness of the third metal layer.

13. The semiconductor device of claim 1, further comprising:
a conductive member made of a metal plate; and
a first conductive bonding material that conductively bonds the first electrode pad and the conductive member.

14. The semiconductor device of claim 13, wherein the semiconductor element includes a second electrode arranged on the element back surface, and
wherein the semiconductor device further comprises:
a first lead formed of a metal plate and including an element bonding portion on which the semiconductor element is mounted; and
a second conductive bonding material that conductively bonds the element bonding portion and the second electrode.

15. The semiconductor device of claim 14, further comprising:
a second lead arranged apart from the first lead when viewed in the thickness direction and formed of a metal plate; and
a third conductive bonding material that conductively bonds the second lead and the conductive member.

16. The semiconductor device of claim 15, wherein the semiconductor element includes a third electrode arranged on the element main surface, and
wherein the semiconductor device further comprises:
a third lead arranged apart from the first lead and the second lead when viewed in the thickness direction and formed of a metal plate; and
a wire that conductively bonds the third electrode and the third lead.

17. The semiconductor device of claim 16, wherein the first electrode is a source electrode, the second electrode is a drain electrode, and the third electrode is a gate electrode.

18. The semiconductor device of claim 1, further comprising a sealing resin that is in contact with the first end edge and the second end edge.

19. The semiconductor device of claim 1, wherein the element main body includes a conductive element.

* * * * *